(12) United States Patent
Kato

(10) Patent No.: US 11,894,074 B2
(45) Date of Patent: Feb. 6, 2024

(54) SEMICONDUCTOR MEMORY DEVICE

(71) Applicant: Kioxia Corporation, Tokyo (JP)

(72) Inventor: Koji Kato, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 224 days.

(21) Appl. No.: 17/469,812

(22) Filed: Sep. 8, 2021

(65) Prior Publication Data

US 2022/0189569 A1 Jun. 16, 2022

(30) Foreign Application Priority Data

Dec. 16, 2020 (JP) ................................. 2020-208454

(51) Int. Cl.
| | |
|---|---|
| *G11C 11/34* | (2006.01) |
| *G11C 16/34* | (2006.01) |
| *G11C 16/24* | (2006.01) |
| *G11C 16/26* | (2006.01) |
| *G11C 16/30* | (2006.01) |
| *G11C 16/10* | (2006.01) |

(52) U.S. Cl.
CPC ........ *G11C 16/3459* (2013.01); *G11C 16/102* (2013.01); *G11C 16/24* (2013.01); *G11C 16/26* (2013.01); *G11C 16/30* (2013.01); *G11C 16/3404* (2013.01)

(58) Field of Classification Search
CPC ............ G11C 16/3454; G11C 14/3459; G11C 11/5628; G11C 16/0483; G11C 2211/5621

USPC ........................................ 365/185.22, 185.19
See application file for complete search history.

(56) References Cited

U.S. PATENT DOCUMENTS

| | | | |
|---|---|---|---|
| 7,196,933 B2 | 3/2007 | Shibata | |
| 9,390,808 B1 | 7/2016 | Kato | |
| 9,627,087 B2 | 4/2017 | Kato et al. | |
| 9,672,926 B2 | 6/2017 | Shiino et al. | |
| 10,096,356 B2 | 10/2018 | Kato et al. | |
| 10,121,522 B1* | 11/2018 | Tseng | ................. G11C 13/0064 |
| 2020/0066363 A1 | 2/2020 | Yang | |
| 2020/0234768 A1* | 7/2020 | Lin | ........................ G11C 16/10 |

FOREIGN PATENT DOCUMENTS

| | | |
|---|---|---|
| JP | 4786171 B2 | 11/2011 |
| JP | 2014225310 A | 12/2014 |

* cited by examiner

*Primary Examiner* — Son T Dinh
(74) *Attorney, Agent, or Firm* — Holtz, Holtz & Volek PC

(57) ABSTRACT

A semiconductor memory device according to an embodiment includes memory cell transistors, a word line, and a controller. A memory cell transistor whose threshold voltage is included in first and second states store first and second data, respectively. In a verify operation of the first data, during application of a verify high voltage of the first data to the word line, the controller is configured to determine whether or not a threshold voltage of a memory cell transistor to which the first data is to be written exceeds the verify high voltage of the first data, and also determine whether or not a threshold voltage of a memory cell transistor to which the second data is to be written exceeds a verify low voltage of the second data.

20 Claims, 22 Drawing Sheets

| Verify target | Loop number | | | | | | | | | | | | | | | | | | |
|---|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 | 18 | 19 |
| "S1" state | ○ | ○ | ○ | ○ | ○ | ○ | | | | | | | | | | | | | |
| "S2" state | | ○ | ○ | ○ | ○ | ○ | ○ | | | | | | | | | | | | |
| "S3" state | | | ○ | ○ | ○ | ○ | ○ | ○ | | | | | | | | | | | |
| "S4" state | | | | ○ | ○ | ○ | ○ | ○ | ○ | | | | | | | | | | |
| "S5" state | | | | | | ○ | ○ | ○ | ○ | ○ | ○ | | | | | | | | |
| "S6" state | | | | | | | | ○ | ○ | ○ | ○ | ○ | ○ | | | | | | |
| "S7" state | | | | | | | | | | | ○ | ○ | ○ | ○ | ○ | ○ | ○ | ○ | ○ |

| Write state | Verify voltage | |
|---|---|---|
| | VL | VH |
| "S1" state | – | V1 |
| "S2" state | V1 | V2 |
| "S3" state | V2 | V3 |
| "S4" state | V3 | V4 |
| "S5" state | V4 | V5 |
| "S6" state | V5 | V6 |
| "S7" state | V6 | V7 |
Verify high voltage VH of "S(N-1)" state is used
F I G. 11
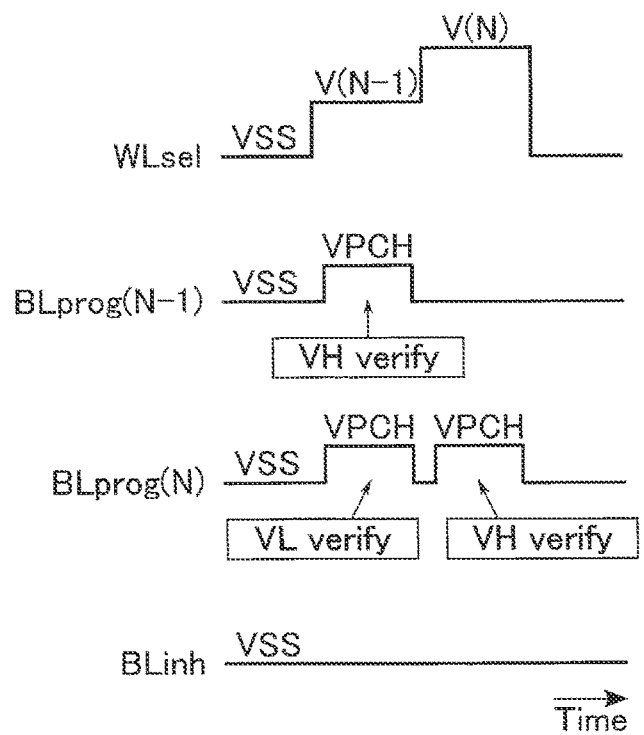
F I G. 12

First modification of first embodiment

| Write state | Verify voltage | |
| --- | --- | --- |
| | VL | VH |
| "S1" state | – | V1 |
| "S2" state | – | V2 |
| "S3" state | V1 | V3 |
| "S4" state | V2 | V4 |
| "S5" state | V3 | V5 |
| "S6" state | V4 | V6 |
| "S7" state | V5 | V7 |

Verify high voltage VH of "S(N-2)" state is used

FIG. 14

Second modification of first embodiment

| Write state | Verify voltage | |
| --- | --- | --- |
| | VL | VH |
| "S1" state | – | V1 |
| "S2" state | V1 | V2 |
| "S3" state | V2 | V3 |
| "S4" state | V3 | V4 |
| "S5" state | V3 | V5 |
| "S6" state | V4 | V6 |
| "S7" state | V5 | V7 |

Verify high voltage VH of "S(N-1)" state and
verify high voltage of VH "S(N-2)" are used in a mixed state

FIG. 15

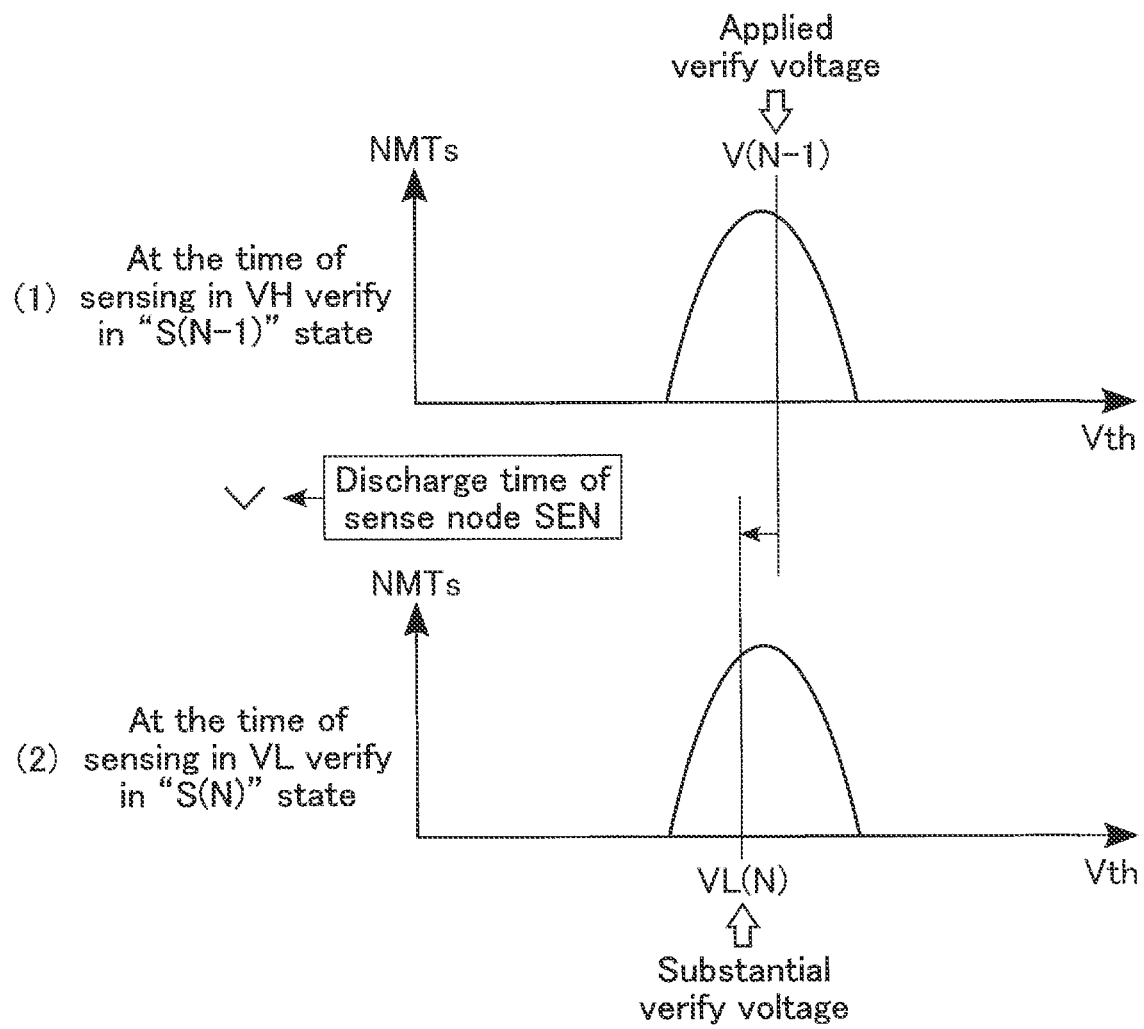
F I G. 20

| Write state | Verify voltage | |
|---|---|---|
| | VL | VH |
| "S1" state | VL1 | V1 |
| "S2" state | V1 | V2 |
| "S3" state | V2 | V3 |
| "S4" state | V3 | V4 |
| "S5" state | V4 | V5 |
| "S6" state | V5 | V6 |
| "S7" state | V6 | V7 |

| Write state | Verify voltage | |
|---|---|---|
| | VL | VH |
| "S1" state | VL1 | V1 |
| — | — | — |
| "S3" state | VL3 | V3 |
| — | — | — |
| "S5" state | VL5 | V5 |
| — | — | — |
| "S7" state | VL7 | V7 |

F I G. 26

SEMICONDUCTOR MEMORY DEVICE

CROSS-REFERENCE TO RELATED APPLICATIONS

This application is based upon and claims the benefit of priority from Japanese Patent Application No. 2020-208454, filed Dec. 16, 2020, the entire contents of which are incorporated herein by reference.

FIELD

Embodiments described herein relate generally a semiconductor memory device.

BACKGROUND

There is known a NAND flash memory capable of storing data in a nonvolatile manner.

BRIEF DESCRIPTION OF THE DRAWINGS

FIG. 11 is a table illustrating an example of how a verify voltage is set for the write operation performed in the semiconductor memory device of the first embodiment;

FIG. 12 is a timing chart illustrating an example of a verify operation performed in the semiconductor memory device of the first embodiment;

FIG. 14 is a table illustrating an example of how a verify voltage is set in the first modification of the first embodiment;

FIG. 15 is a table illustrating an example of how a verify voltage is set in the second modification of the first embodiment;

FIG. 20 is a conceptual diagram illustrating an example of a substantial verify voltage used in the semiconductor memory device of the fourth embodiment;

FIG. 26 is a table illustrating an example of how a verify voltage is set in the modification of the seventh embodiment;

DETAILED DESCRIPTION

In general, according to one embodiment, a semiconductor memory device includes a plurality of memory cell transistors, a word line, and a controller. The memory cell transistors each store a plurality of bits of data. A threshold voltage of each of the memory cell transistors is included in one of a plurality of states. The states includes a first state and a second state. The second state is higher than the first state. A memory cell transistor whose threshold voltage is included in the first state stores first data. A memory cell transistor whose threshold voltage is included in the second state stores second data. The word line is coupled to the memory cell transistors. The controller is configured to perform a write operation that includes repetition of a program loop including a program operation and a verify operation. A verify low voltage and a verify high voltage higher than the verify low voltage are set for each of the states. In a verify operation of the first data, during application of a verify high voltage of the first data to the word line, the controller is configured to determine whether or not a threshold voltage of a memory cell transistor to which the first data is to be written exceeds the verify high voltage of the first data, and also determine whether or not a threshold voltage of a memory cell transistor to which the second data is to be written exceeds a verify low voltage of the second data.

Hereinafter, embodiments will be described with reference to the accompanying drawings. Each embodiment illustrates an apparatus and a method for embodying the technical idea of the invention. The drawings are schematic or conceptual. The dimensions and scales of the drawings are not necessarily the same as those of actual products. The technical concept underlying the present invention is not limited by the shapes, structures, arrangements, etc. of the components.

In the description below, elements having substantially the same functions and configurations will be denoted by the same reference symbols. The numbers after the letters of reference symbols are referred to by the reference symbols containing the same letters and are used to distinguish between elements having similar configurations. Where elements denoted by reference symbols including the same letters need not be discriminated from each other, they will be denoted by reference symbols including only numerals.

[1] First Embodiment

The semiconductor memory device 1 according to the first embodiment is one type of a NAND flash memory capable of storing data in a nonvolatile manner. The semiconductor memory device 1 according to the first embodiment will be described.

[1-1] Configuration

[1-1-1] Overall Configuration of Semiconductor Memory Device 1

Figure 1:
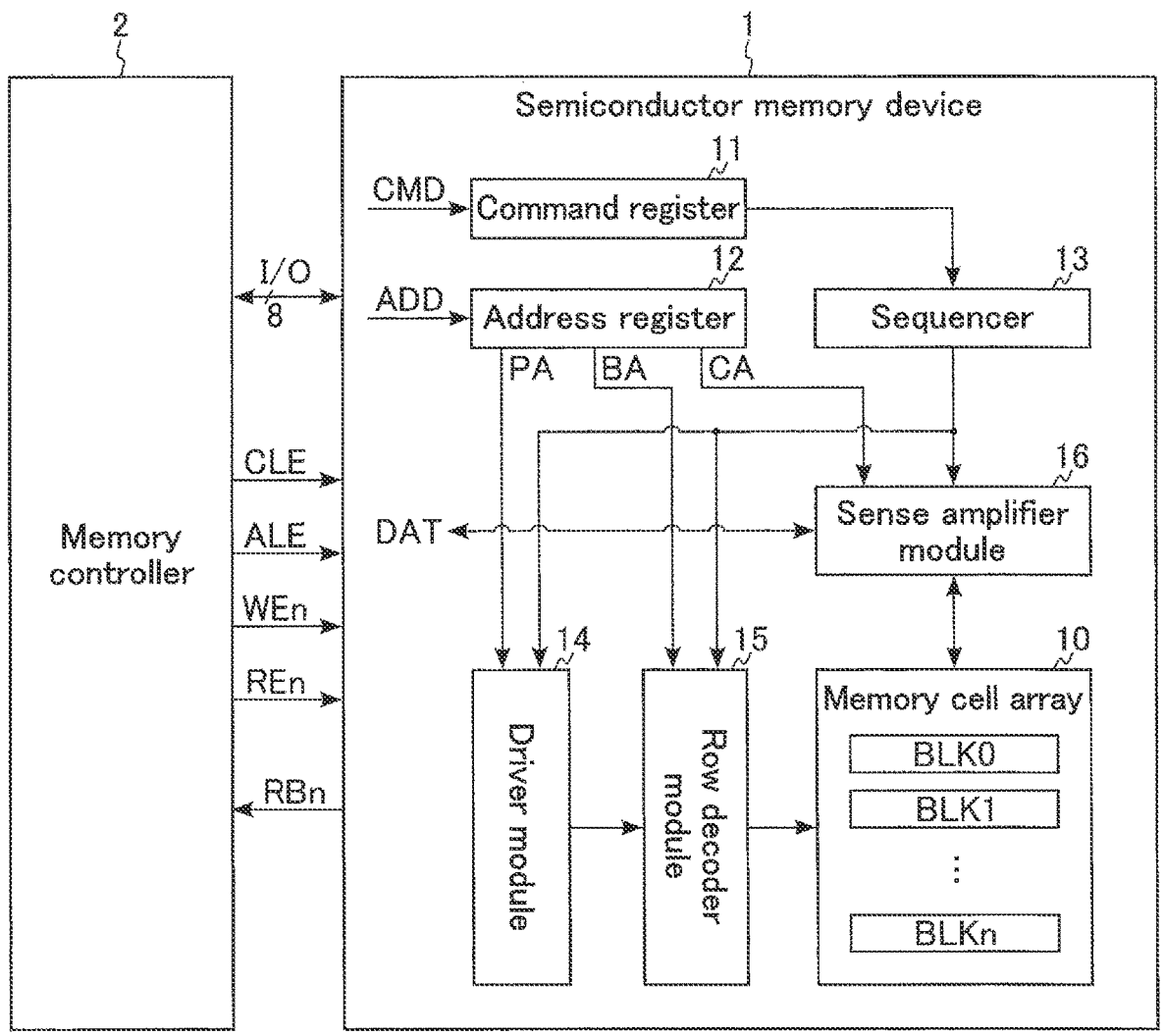
FIG. 1 is a block diagram illustrating an example of a configuration of a semiconductor memory device according to the first embodiment.

FIG. 1 illustrates an example of a configuration of the semiconductor memory device 1 according to the first embodiment. As illustrated in FIG. 1, the semiconductor memory device 1 is configured to be controllable by an external memory controller 2. The semiconductor memory device 1 includes, for example, a memory cell array 10, a command register 11, an address register 12, a sequencer 13, a driver module 14, a row decoder module 15 and a sense amplifier module 16.

The memory cell array 10 includes a plurality of blocks BLK0 to BLKn (n is an integer of 1 or more). Each block BLK includes a set of memory cells capable of storing data in a nonvolatile manner. The block BLK is used, for example, as a data erase unit. The memory cell array 10 is provided with a plurality of bit lines and a plurality of word lines, which will be described later. Each memory cell is associated with one bit line and one word line.

The command register 11 stores a command CMD which the semiconductor memory device 1 receives from the memory controller 2. The command CMD includes an instruction for causing the sequencer 13 to execute a read operation, a write operation, an erase operation, etc.

The address register 12 stores address information ADD which the semiconductor memory device 1 receives from the memory controller 2. The address information ADD includes, for example, a block address BA, a page address PA, and a column address CA. The block address BA, the page address PA and the column address CA are associated with a block BLK, a word line and a bit line, respectively.

The sequencer 13 controls the overall operation of the semiconductor memory device 1. For example, the sequencer 13 controls the driver module 14, the row decoder module 15, the sense amplifier module 16 etc., based on the command CMD stored in the command register 11, to execute a read operation, a write operation, an erase operation, etc.

The driver module 14 is coupled to the row decoder module 15 via a plurality of signal lines and generates voltages used in the read operation, the write operation, the erase operation, etc. For example, the driver module 14 applies predetermined voltages to a signal line coupled to the word line selected based on the page address PA stored in the address register 12 and to signal lines coupled to the other word lines.

The row decoder module 15 transfers the voltages which the driver module 14 applies to the plurality of signal lines to the memory cell array 10. Further, in the memory cell array 10, the row decoder module 15 selects one block BLK associated with the block address BA stored in the address register 12, and transfers the voltages applied to different sets of signal lines between the selected block BLK and the unselected blocks BLK.

The sense amplifier module 16 transmits/receives data DAT to/from the memory controller 2 via an input/output circuit (not illustrated). In the write operation, the sense amplifier module 16 applies a voltage corresponding to the write data received from the memory controller 2 to each bit line. In the read operation, the sense amplifier module 16 determines the data stored in the memory cell, based on the voltage of the bit line, and transmits the read data determined based on the determination result to the memory controller 2.

Communications between the semiconductor memory device 1 and the memory controller 2 support, for example, a NAND interface standard. For example, in the communications between the semiconductor memory device 1 and the memory controller 2, an input/output signal I/O, a command latch enable signal CLE, an address latch enable signal ALE, a write enable signal WEn, a read enable signal REn and a ready/busy signal RBn are used.

The input/output signal I/O is, for example, an 8-bit signal and may include a command CMD, address information ADD, data DAT, etc. The command latch enable signal CLE is a signal indicating whether or not the input/output signal I/O received by the semiconductor memory device 1 is a command CMD. The address latch enable signal ALE is a signal indicating whether or not the input/output signal I/O received by the semiconductor memory device 1 is address information ADD. The write enable signal WEn is a signal for instructing the semiconductor memory device 1 to input the input/output signal I/O. The read enable signal REn is a signal for instructing the semiconductor memory device 1 to output the input/output signal I/O. The ready/busy signal RBn is a signal that notifies the memory controller 2 whether the semiconductor memory device 1 is in a ready state or in a busy state. The ready state is a state in which the semiconductor memory device 1 accepts an instruction from the memory controller 2. The busy state is a state in which the semiconductor memory device 1 does not accept an instruction from the memory controller 2.

The semiconductor memory device 1 and memory controller 2 may constitute one semiconductor device by combining them together. Examples of such a semiconductor device include a memory card such as an SD™ card, and a solid state drive (SSD).

[1-1-2] Configuration of Semiconductor Memory Device 1

(Circuit Configuration of Memory Cell Array 10)

Figure 2:
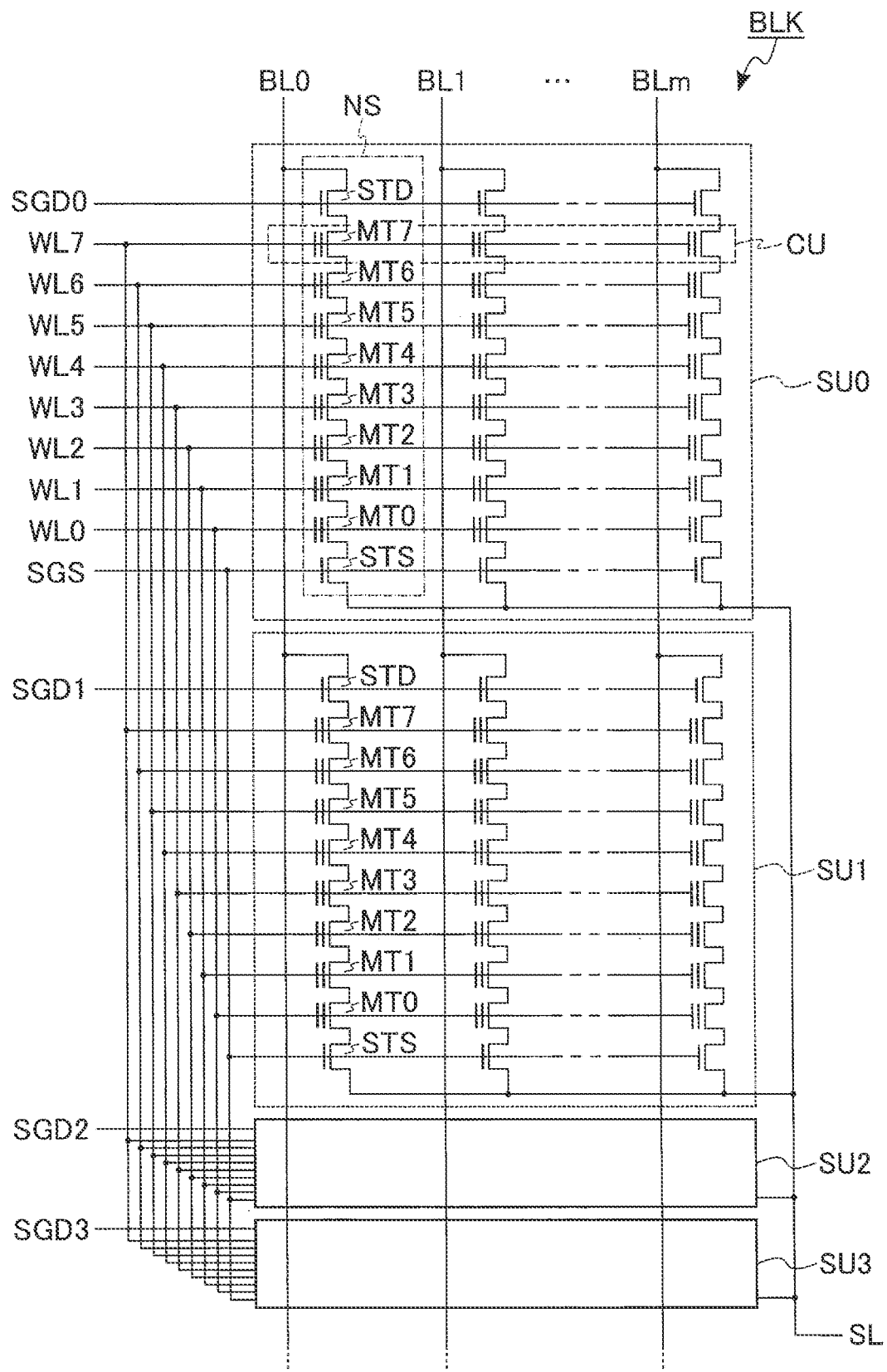
FIG. 2 is a circuit diagram illustrating an example of a circuit configuration of a memory cell array in the semiconductor memory device of the first embodiment.

FIG. 2 is a circuit diagram illustrating an example of a circuit configuration of the memory cell array 10 provided in the semiconductor memory device 1 of the first embodiment. In FIG. 2, one block BLK included in the memory cell array 10 is extracted and illustrated. As illustrated in FIG. 2, the block BLK includes, for example, four string units SU0 to SU3. The block BLK includes a plurality of bit lines BL0 to BLm (m is an integer of 1 or more), a plurality of word lines WL0 to WL7, a plurality of select gate lines SGD0 to SGD3, a select gate line SGS and a source line SL.

Each string unit SU includes a plurality of NAND strings NS. Different column addresses are assigned to the plurality of NAND strings NS. The plurality of NAND strings NS in each string unit SU are associated with bit lines BL0 to BLm, respectively. A plurality of NAND strings NS to which the same column address is assigned are coupled to the respective bit lines BL. A set consisting of the plurality of word lines WL0 to WL7, the plurality of select gate lines SGD0 to SGD3 and the select gate line SGS is provided for each block BLK. The source line SL is shared by a plurality of blocks BLK.

Each NAND string NS includes memory cell transistors MT0 to MT7 and select transistors STD and STS. Each of the memory cell transistors MT includes a control gate and a charge storage layer, and holds data in a nonvolatile manner according to a threshold voltage. The select transistors STD and STS are used, for example, for selecting a string unit SU during the write operation, the read operation, the erase operation, etc.

In each NAND string NS, memory cell transistors MT0 to MT7 are coupled in series. The drain of the select transistor STD is coupled to the associated bit line BL. The source of the select transistor STD is coupled to one end of the memory cell transistors MT0 to MT7 coupled in series. The drain of the select transistor STS is coupled to the other end of the memory cell transistors MT0 to MT7 coupled in series. The source of the select transistor STS is coupled to the source line SL.

The control gates of the memory cell transistors MT0 to MT7 included in the same block BLK are coupled to the word lines WL0 to WL7, respectively. The gates of the select transistors STD in the string unit SU0 are coupled to the select gate line SGD0. The gates of the select transistors STD in the string unit SU1 are coupled to the select gate line SGD1. The gates of the select transistors STD in the string unit SU2 are coupled to the select gate line SGD2. The gates of the select transistors STD in the string unit SU3 are coupled to the select gate line SGD3. The gates of the select transistors STS included in the same block BLK are coupled to the select gate line SGS.

Hereinafter, a set of memory cell transistors MT coupled to a common word line WL in one string unit SU will be referred to as a "cell unit CU". For example, the storage capacity of the cell unit CU including a plurality of memory cell transistors MT each storing 1-bit data is defined as "1 page data". The memory cell transistor MT may have a storage capacity of 2 bits of data or more. The cell unit CU can have a storage capacity of two pages of data or more in accordance with the number of bits of data stored in the memory cell transistor MT. In connection with the first embodiment, a description will be given of the configuration and operation of the case where one memory cell transistor MT stores 3-bit data.

The memory cell array 10 may have other circuit configurations. For example, the number of string units SU included in each block BLK and the numbers of memory cell transistors MT and select transistors STD and STS included in each NAND string NS may be changed. The NAND string NS may include one or more dummy transistors. A select gate line SGS may be provided for each string unit SU.

(Circuit Configuration of Row Decoder Module 15)

Figure 3:
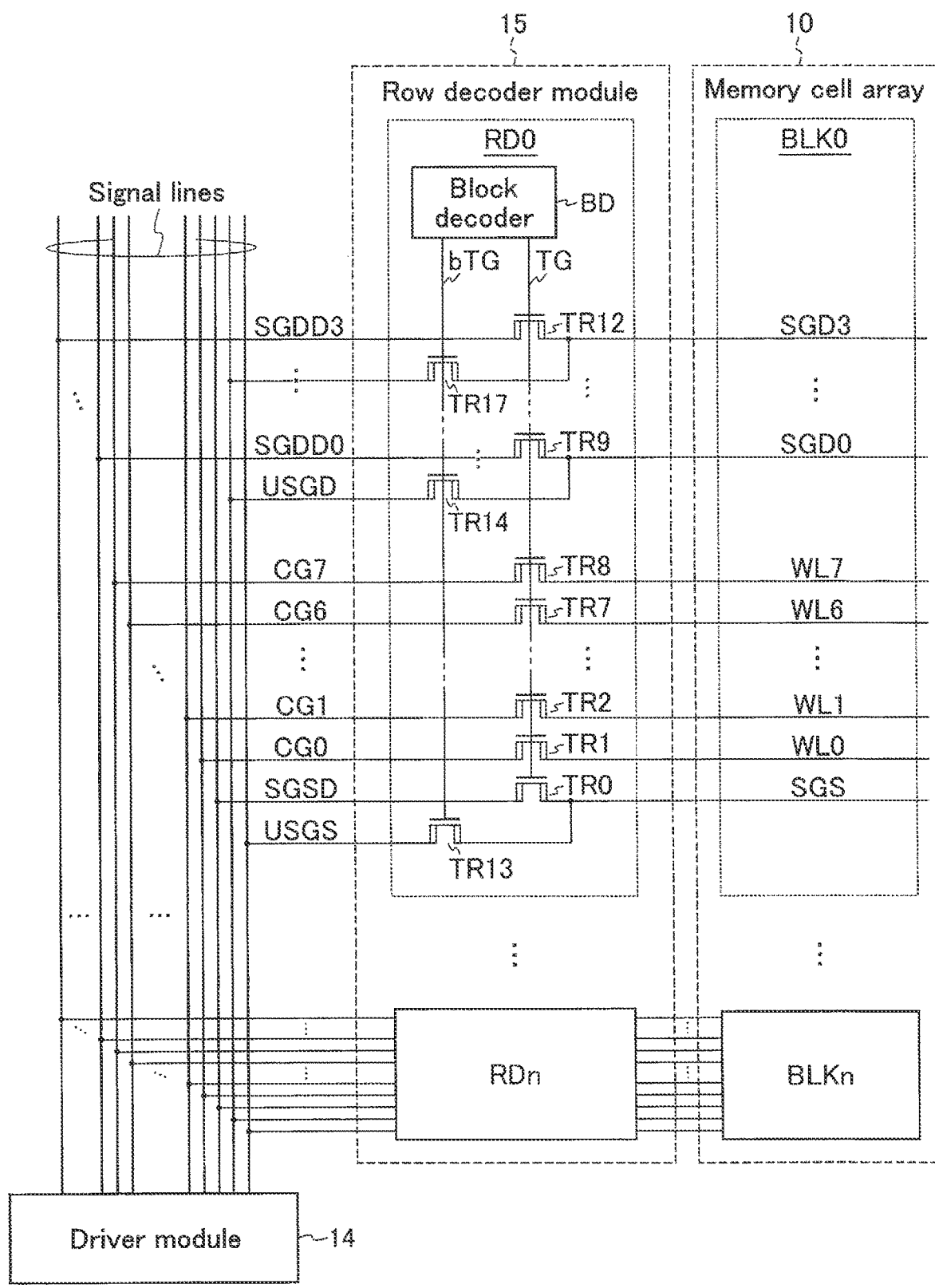
FIG. 3 is a circuit diagram illustrating an example of a circuit configuration of a row decoder module in the semiconductor memory device of the first embodiment.

FIG. 3 is a circuit diagram illustrating an example of a circuit configuration of the row decoder module 15 provided in the semiconductor memory device 1 of the first embodiment. As illustrated in FIG. 3, the row decoder module 15 is coupled to the driver module 14 via signal lines CG0 to CG7, SGDD0 to SGDD3, SGSD, USGD and USGS. The row decoder module 15 includes row decoders RD0 to RDn (n is an integer of 1 or more). The row decoders RD0 to RDn are associated with the blocks BLK0 to BLKn, respectively. A detailed circuit configuration of the row decoder RD will be described below, focusing on the row decoder RD0.

The row decoder RD includes, for example, transistors TR0 to TR17, transfer gate lines TG and bTG and a block decoder BD.

Each of the transistors TR0 to TR17 is a high-breakdown-voltage N-type MOS transistor. The gates of the transistors TR0 to TR12 are coupled to the transfer gate line TG. The gates of the transistors TR13 to TR17 are coupled to the transfer gate line bTG. The drain and source of each transistor TR are coupled between one of the plurality of signal lines coupled to the driver module 14 and one of the plurality of interconnects coupled to the block BLK associated with the row decoder RD.

Specifically, the drain of the transistor TR0 is coupled to the signal line SGSD. The source of the transistor TR0 is coupled to the select gate line SGS. The drains of the transistors TR1 to TR8 are coupled to the signal lines CG0 to CG7, respectively. The sources of the transistors TR1 to TR8 are coupled to the word lines WL0 to WL7, respectively. The drains of the transistors TR9 to TR12 are coupled to the signal lines SGDD0 to SGDD3, respectively. The drains of the transistors TR9 to TR12 are coupled to the select gate lines SGD0 to SGD3, respectively. The drain of the transistor TR13 is coupled to the signal line USGS. The source of the transistor TR13 is coupled to the select gate line SGS. The drains of the transistors TR14 to TR17 are coupled to the signal line USGD. The drains of the transistors TR14 to TR17 are coupled to the select gate lines SGD0 to SGD3, respectively.

The block decoder BD decodes a block address BA. The block decoder BD applies predetermined voltages to the transfer gate lines TG and bTG, based on the decoding result. The voltage applied to the transfer gate line TG and the voltage applied to the transfer gate line bTG have a complementary relationship. In other words, the inverted signal of a signal of the transfer gate line TG is input to the transfer gate line bTG.

The row decoder module 15 can select a block BLK by inputting a block address BA to each of the block decoders BD of the row decoders RD0 to RDn. For example, during a read or write operation, the block decoder BD associated with a selected block BLK applies "H" and "L" level voltages to the transfer gate lines TG and bTG, respectively. On the other hand, the block decoders BD associated with the unselected blocks BLK apply "L" and "H" level voltages to the transfer gate lines TG and bTG, respectively. As a result, the voltages applied to the different signal lines are transferred to the selected block BLK and the unselected blocks BLK.

The row decoder module 15 may have other circuit configurations. For example, the number of transistors TR included in the row decoder module 15 may be changed in accordance with the number of interconnects provided in each block BLK. Since the signal line CG is shared by a plurality of blocks BLK, it may be called a "global word line". Since the word line WL is provided for each block, it may be called a "local word line". Since each of the signal lines SGDD and SGSD is shared by a plurality of blocks BLK, it may be referred to as a "global transfer gate line". Since each of the selected gate lines SGD and SGS is provided for each block, it may be referred to as "local transfer gate line".

(Circuit Configuration of Sense Amplifier Module 16)

Figure 4:
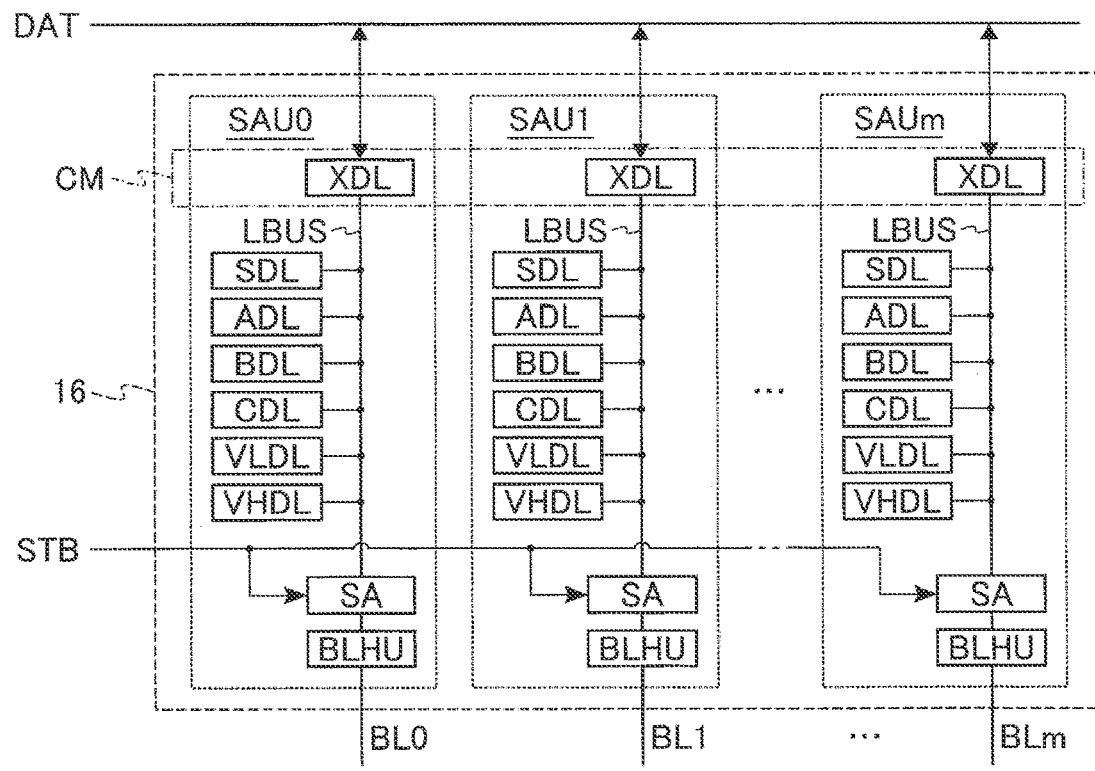
FIG. 4 is a circuit diagram illustrating an example of a circuit configuration of a sense amplifier module provided in the semiconductor memory device of the first embodiment.

FIG. 4 is a circuit diagram illustrating an example of the circuit configuration of the sense amplifier module 16 provided in the semiconductor memory device 1 of the first embodiment. As illustrated in FIG. 4, the sense amplifier module 16 includes sense amplifier units SAU0 to SAUm (m is an integer of 1 or more). The sense amplifier units SAU0 to SAUm are associated with the bit lines BL0 to BLm, respectively. A detailed circuit configuration of the sense amplifier unit SAU will be described below, focusing on the sense amplifier unit SAU0.

The sense amplifier unit SAU includes, for example, a bit line connection unit BLHU, a sense amplifier section SA, a bus LBUS and latch circuits SDL, ADL, BDL, CDL, VLDL, VHDL and XDL. The bit line connection unit BLHU includes a high-breakdown-voltage transistor coupled between the bit line BL and the sense amplifier section SA. The sense amplifier section SA includes a circuit for determining how the threshold voltage of the memory cell transistor MT is, based on the voltage of the bit line BL. Each of the latch circuits SDL, ADL, BDL, CDL, VLDL, VHDL and XDL is a circuit capable of temporarily storing data.

The sense amplifier section SA and the latch circuits SDL, ADL, BDL, CDL, VLDL, VHDL and XDL are coupled to the bus LBUS. The latch circuits SDL, ADL, BDL, CDL, VLDL, VHDL and XDL can send and receive data to and from each other via the bus LBUS. The latch circuit XDL is used for the input/output of data DAT between the input/output circuit of the semiconductor memory device 1 and the sense amplifier unit SAU. The latch circuit XDL can also be used as a cache memory CM of the semiconductor memory device 1. The semiconductor memory device 1 can be in the ready state at least when the latch circuit XDL is vacant.

A control signal STB generated by the sequencer 13 is input to each sense amplifier section SA. When the control signal STB is asserted, the sense amplifier section SA determines the data stored in the selected memory cell transistor MT. Briefly speaking, when the control signal STB is asserted, the sense amplifier section SA discharges the bus LBUS in accordance with the voltage of the associated bit line BL. Data ("0" or "1") that is based on the voltage of the bus LBUS at the time is stored in one of the latch circuits sharing the bus LBUS.

Figure 5:
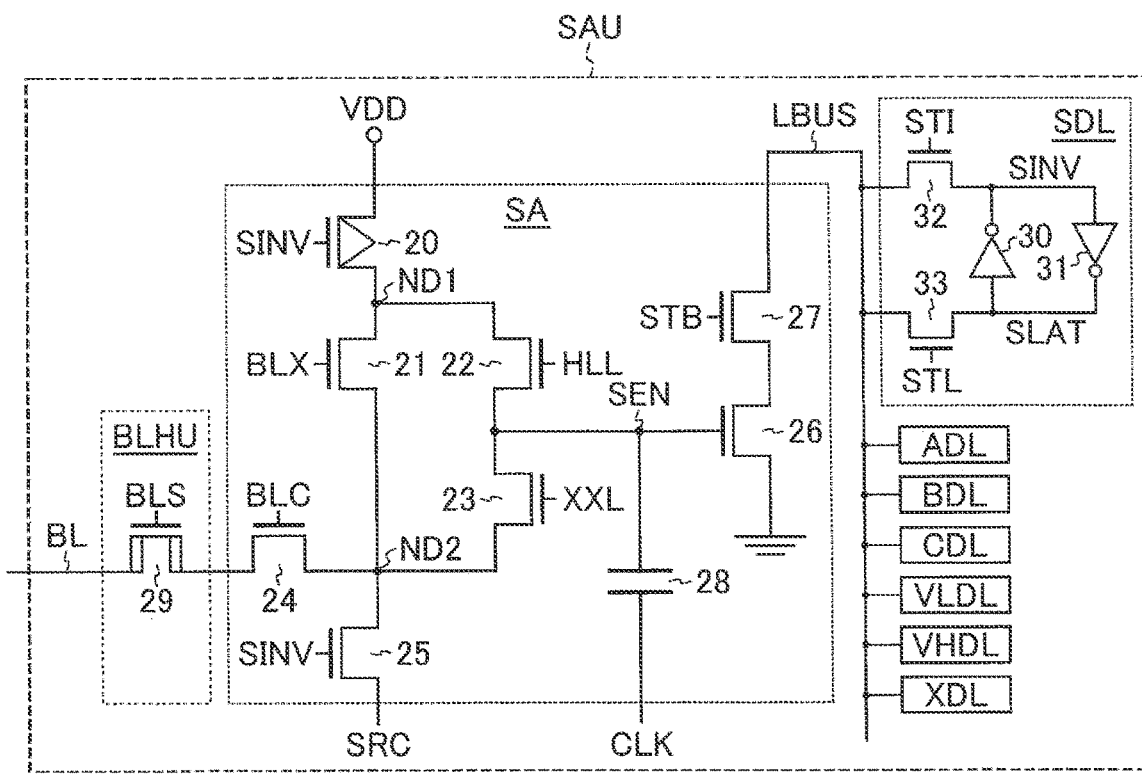
FIG. 5 is a circuit diagram illustrating an example of a circuit configuration of a sense amplifier unit included in the sense amplifier module of the semiconductor memory device of the first embodiment.

FIG. 5 is a circuit diagram illustrating an example of the circuit configuration of the sense amplifier unit SAU included in the sense amplifier module 16 provided in the semiconductor memory device 1 of the first embodiment. As illustrated in FIG. 5, the sense amplifier section SA includes transistors 20 to 27, a capacitor 28, nodes ND1 and ND2 and a sense node SEN. The bit line connection unit BLHU includes a transistor 29. The latch circuit SDL includes inverters 30 and 31, transistors 32 and 33 and nodes SINV and SLAT.

The transistor 20 is a P-type MOS transistor. Each of the transistors 21 to 27 is an N-type MOS transistor. The source of the transistor 20 is coupled to a power supply line. A power supply voltage VDD is applied to the power supply line. The drain of the transistor 20 is coupled to the node ND1. The gate of the transistor 20 is coupled to the node SINV. The drain of the transistor 21 is coupled to the node ND1. The source of the transistor 21 is coupled to the node ND2. The gate of the transistor 21 is coupled to the node BLX. The drain of the transistor 22 is coupled to the node ND1. The source of the transistor 22 is coupled to the sense node SEN. The gate of the transistor 22 is coupled to the node HLL. The drain of the transistor 23 is coupled to the sense node SEN. The source of the transistor 23 is coupled to the node ND2. The gate of the transistor 23 is coupled to the node XXL.

The drain of the transistor 24 is coupled to the node ND2. The gate of the transistor 24 is coupled to the node BLC. The drain of the transistor 25 is coupled to the node ND2. The source of the transistor 25 is coupled to the node SRC. For example, a ground voltage VSS is applied to the node SRC. The gate of the transistor 25 is coupled to the node SINV. The source of the transistor 26 is grounded. The gate of the transistor 26 is coupled to the sense node SEN. The drain of the transistor 27 is coupled to the bus LBUS. The source of the transistor 27 is coupled to the drain of the transistor 26. The control signal STB is input to the gate of the transistor 27. One electrode of the capacitor 28 is coupled to the sense node SEN. A clock CLK is input to the other electrode of the capacitor 28.

The transistor 29 is an N-type MOS transistor having a higher breakdown voltage than each of the transistors 20 to 27. The drain of the transistor 29 is coupled to the source of the transistor 24. The source of the transistor 29 is coupled to the bit line BL. The gate of the transistor 29 is coupled to the node BLS.

The input node of the inverter 30 is coupled to the node SLAT. The output node of the inverter 30 is coupled to the node SINV. The input node of the inverter 31 is coupled to the node SINV. The output node of the inverter 31 is coupled to the node SLAT. Each of the transistors 32 and 33 is an N-type MOS transistor. The source and drain of the transistor 32 are coupled between the node SINV and the bus LBUS. The gate of the transistor 32 is coupled to the node STI. The source and drain of the transistor 33 are coupled between the node SLAT and the bus LBUS. The gate of the transistor 33 is coupled to the node STL. The latch circuit SDL stores data at the node SLAT. On the other hand, the latch circuit SDL stores inverted data of the data of the node SLAT at the node SINV.

The circuit configurations of the latch circuits ADL, BDL, CDL, VLDL, VHDL and XDL are similar to the circuit configuration of the latch circuit SDL, for example. Briefly speaking, the latch circuit ADL has a configuration similar to that of the latch circuit SDL, except that the nodes SLAT and SINV are respectively replaced with nodes ALAT and AINV, and the nodes STL and STI are respectively replaced with nodes ATL and ATI. The latch circuit ADL stores data at the node ALAT, and stores inverted data of the data of the node ALAT at the node AINV. The description of the latch circuits BDL, CDL, VLDL, VHDL and XDL will be omitted.

Each of the nodes BLX, HLL, XXL, BLC, BLS, STI, STL, ATL and ATI is shared, for example, among a plurality of sense amplifier units SAU. A control signal generated by the sequencer 13 is input to each of the nodes BLX, HLL, XXL, BLC, BLS, STI, STL, ATL and ATI. The sense amplifier module 16 may have other circuit configurations. For example, the number of latch circuits included in each sense amplifier unit SAU can be changed in accordance with the number of bits that can be stored in one memory cell transistor MT.

[1-1-3] Data Storage Method

Figure 6:
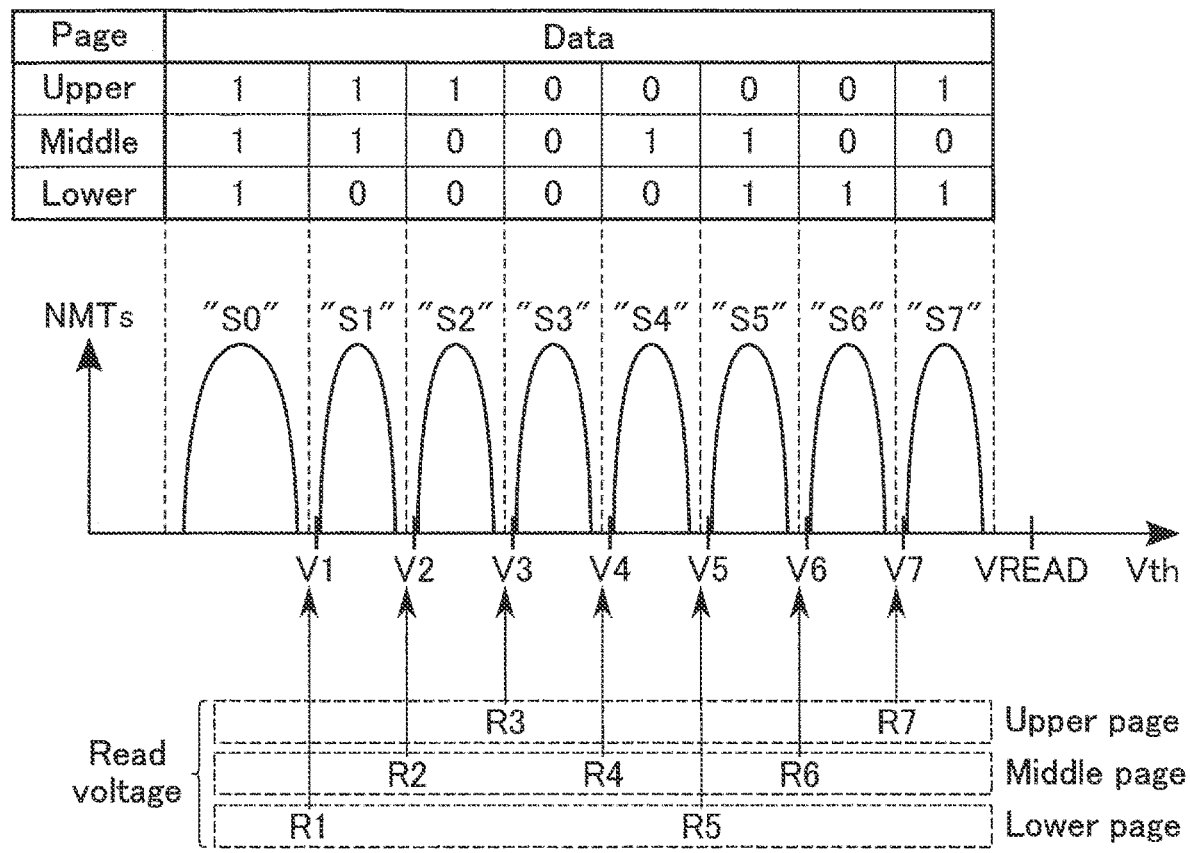
FIG. 6 is a conceptual diagram illustrating an example of a data storage method used in the semiconductor memory device of the first embodiment.

FIG. 6 is a conceptual diagram illustrating an example of a data storage method used in the semiconductor memory device 1 of the first embodiment. FIG. 6 illustrates an example of how threshold voltage distributions of memory cell transistors MT are, and also illustrates an example of voltages used for data allocation and data read. In the threshold voltage distribution diagram referred to below, "NMTs" on the vertical axis indicates the number of memory cell transistors MT, and "Vth" on the horizontal axis indicates the threshold voltages of the memory cell transistors MT.

As illustrated in FIG. 6, where one memory cell transistor MT stores 3-bit data, the threshold voltage distribution formed by the plurality of memory cell transistors MT included in the cell unit CU can have eight states. In the description below, these eight states will be referred to as an "S0" state, an "S1" state, an "S2" state, an "S3" state, an "S4" state, an "S5" state, an "S6" state and an "S7" state in the order from the lowest threshold voltage. A method of storing 3-bit data in one memory cell transistor is also called a TLC (Triple-Level Cell) method.

Where the memory cell transistor MT is in the erased state, the threshold voltage of the memory cell transistor MT is in the "S0" state. Where data is written to the memory cell transistor MT, the threshold voltage of the memory cell transistor MT is one of the "S0" to "S7" states. Different 3-bit data are assigned to the "S0" to "S7" states. Preferably, data allocation is performed such that only 1-bit data is different between the two adjacent states. The following is an example of how data allocation is performed for the eight states.

"S0" state: "111" (upper bit/middle bit/lower bit) data
"S1" state: "110" data
"S2" state: "100" data
"S3" state: "000" data
"S54" state: "010" data
"S5" state: "Oil" data
"S6" state: "001" data
"S7" state: "101" data A verify voltage used for confirming data write and a read voltage used for reading data are set between the adjacent states. Specifically, a verify voltage V1 and a read voltage R1 are set between the "S0" and "S1" states. A verify voltage V2 and a read voltage R2 are set between the "S1" and "S2" states. A verify voltage V3 and a read voltage R3 are set between the "S2" and "S3" states. A verify voltage V4 and a read voltage R4 are set between the "S3" and "S4" states. A verify voltage V5 and a read voltage R5 are set between the "S4" and "S5" states. A verify voltage V6 and a read voltage R6 are set between the "S5" and "S6" states. A verify voltage V7 and a read voltage R7 are set between the "S6" and "S7" states. It is preferable that the verify voltages V1 to V7 are set to be higher than the read voltages R1 to R7, respectively.

The verify voltages V1 to V7 are associated with the "S1" to "S7" states, respectively. In a write operation, the semiconductor memory device 1 performs a read operation using a verify voltage (hereinafter referred to as a verify read) so as to confirm whether the threshold voltage of the memory cell transistor MT to which data is to be written exceeds the verify voltage associated with the data. When the sequencer 13 detects that the threshold voltage of the memory cell transistor MT exceeds the verify voltage associated with the data, the sequencer 13 completes writing the data to the memory cell transistor MT.

The read voltage R1 is used to distinguish between the "S0" state and the "S1" and higher states. The read voltage R2 is used to distinguish between the "S1" and lower states and the "S2" and higher states. The read voltage R3 is used to distinguish between the "S2" and lower states and the "S3" and higher states. The read voltage R4 is used to distinguish between the "S3" and lower states and the "S4" and higher states. The read voltage R5 is used to distinguish between the "S4" and lower states and the "S5" and higher states. The read voltage R6 is used to distinguish between the "S5" and lower states and the "S6" and higher states. The read voltage R7 is used to distinguish between the "S6" and lower states and the "S7" and higher states. A read pass voltage VREAD is set to a voltage higher than the highest state. The memory cell transistor MT whose gate is applied with the read pass voltage VREAD is turned on regardless of the data it stores.

In a read operation, the semiconductor memory device 1 uses at least one read voltage to determine in which state the memory cell transistor MT is distributed. For example, lower page data, which is a set of lower bit data, is determined by a read operation using the read voltages R1 and R5. Middle page data, which is a set of middle bit data, is determined by a read operation using each of the read voltages R2, R4 and R6. Higher page data, which is a set of higher bit data, is determined by a read operation using each of the read voltages R3 and R7. In a page read operation in which a plurality of read voltages are used, arithmetic processing is executed as appropriate.

The semiconductor memory device 1 may use other data allocations in the TLC method. The semiconductor memory device 1 may use a storage method other than the TLC method, and may use any data allocation. For example, one memory cell transistor MT may store 2-bit data or 4-bit data or more. The operations described herein can be performed regardless of the data storage method or the type of data allocation.

In the present specification, a one-state preceding state is intended to refer to a state that is adjacent and has a lower threshold voltage. For example, the state which is one-state preceding the "S2" state is the "S1" state. A two-state preceding state is intended to refer to a state which is one of two states sandwiching a given state and which has the lower threshold voltage than the other. For example, the state which is two-state preceding the "S3" state is the "S1" state. In this manner, the relationship between the two states may be indicated by the number of states arranged between them.

[1-2] Operation

Next, a description will be given of the operation performed by the semiconductor memory device 1 of the first embodiment. In the description below, a word line WL selected based on a page address PA will be referred to as "word line WLsel", and an unselected word line WL will be referred to as "word line WLusel". The memory cell transistor MT coupled to the word line WLsel will be referred to as a "memory cell transistor MTsel". The application of a voltage to the word line WL is executed by the driver module 14 and the row decoder module 15. The application of a voltage to the bit line BL is executed by the sense amplifier unit SAU.

[1-2-1] Outline of Write Operation

Figures 7, 8:
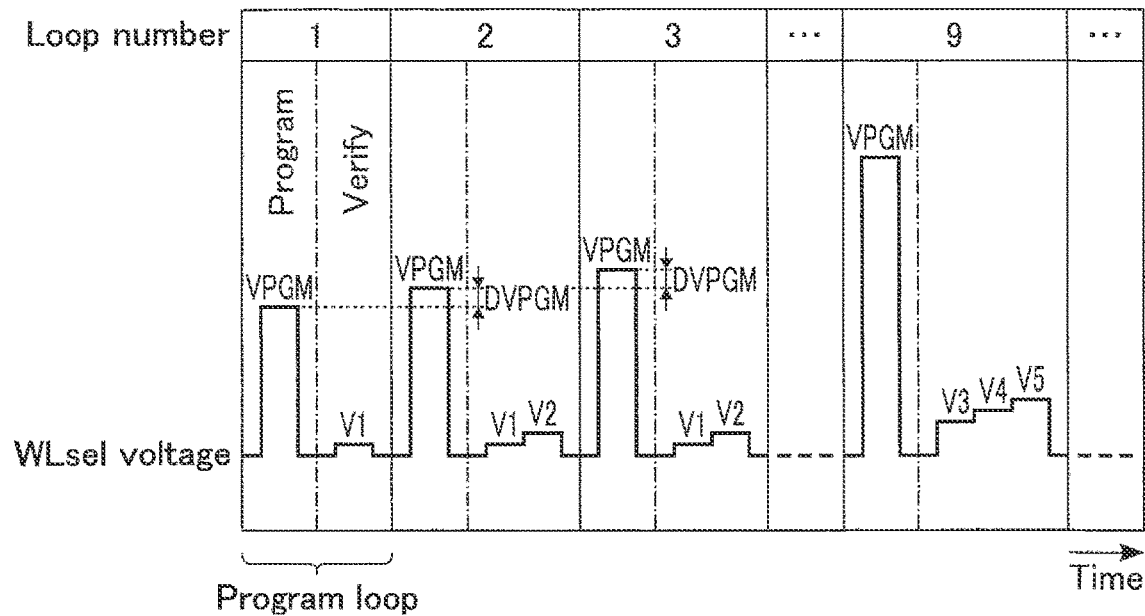
FIG. 7 is a timing chart illustrating an outline of a write operation performed in the semiconductor memory device of the first embodiment.
FIG. 8 is a table illustrating an example of how a program loop is set in the write operation performed in the semiconductor memory device of the first embodiment.

FIG. 7 is a timing chart illustrating an outline of a write operation performed by the semiconductor memory device 1 of the first embodiment. As illustrated in FIG. 7, the semiconductor memory device 1 repeatedly executes a program loop in the write operation. FIG. 7 illustrates the number of times the program loop is executed in the write operation (hereinafter referred to as the number of loops) and also illustrates how the voltage of the word line WLsel (WLsel voltage) changes. Each program loop includes a program operation (Program) and a verify operation (Verify).

The program operation increases the threshold voltage of the memory cell transistor MT. In the program operation, a plurality of memory cell transistors MTsel coupled to the word line WLsel are set as program-target or program-inhibit, based on the write data stored in the associated sense amplifier unit SAU. Specifically, the memory cell transistor MTsel that has not reached the threshold voltage of a write target state (hereinafter referred to as a write state) is set as program-target. On the other hand, the memory cell transistor MTsel that has reached the threshold voltage of the write state is set as program-inhibit.

In the program operation, a program voltage VPGM is applied to the word line WLsel. The program voltage VPGM is a high voltage that can increase the threshold voltage of the memory cell transistor MTsel. The program voltage VPGM is stepped up, for example, every time the program loop is executed. That is, the program voltage VPGM increases in accordance with the number of times the program loop is executed. When the program voltage VPGM is applied to the word line WLsel, the threshold voltage of the memory cell transistor MTsel that is coupled to the word line WLsel and coupled to the program-target bit line BL increases. On the other hand, an increase in the threshold voltage of the memory cell transistor MTsel that is coupled to the word line WLsel and coupled to the program-inhibit bit line BL is suppressed by a self-boost technique or the like. When the program operation ends, the sequencer 13 executes the verify operation.

The verify operation is a read operation for confirming whether or not the threshold voltage of the memory cell transistor MTsel has reached the threshold voltage of the write state. In the same program loop, the sequencer 13 executes a read operation using a predetermined verify voltage for a memory cell transistor MTsel that is set as program-target and in the write state of the verify target. Hereinafter, the read operation executed in the verify operation will be referred to as a verify read as well.

In the verify read, the sense amplifier unit SAU determines whether or not the threshold voltage of the memory cell transistor MTsel has exceeded the verify voltage applied to the word line WLsel, based on the voltage of the bit line BL. Each sense amplifier unit SAU determines that the memory cell transistor MTsel whose threshold voltage has exceeded the verify voltage and can therefore be regarded as having reached the threshold voltage of the write state is a "verify pass". On the other hand, each sense amplifier unit SAU determines that the memory cell transistor MTsel whose threshold voltage is equal to or lower than the verify voltage and can therefore be regarded as not having reached the threshold voltage of the write state is a "verify fail". Each sense amplifier unit SAU stores a verify result of the write state mentioned above in one of internal latch circuits. When the verify operation is completed, the sequencer 13 sets each memory cell transistor MTsel as program-target or program-inhibit, based on the verify result in the current program loop, and starts processing of the next program loop.

The semiconductor memory device 1 can appropriately execute a detection operation ("Detection") after each program loop. In the detection operation, the number of memory cell transistors MT that have passed the verify is counted for each write state. Then, the sequencer 13 determines whether or not the write of the write state is completed for each write state. If, in the repetition of the program loop, the sequencer 13 detects that the number of memory cell transistors MT that have not passed the verify of the "S1" to "S7" states is below a predetermined number, the write operation is ended.

FIG. 8 is a table illustrating an example of how a program loop is set in the write operation performed in the semiconductor memory device 1 of the first embodiment. The table illustrated in FIG. 8 illustrates the relationship between the number of loops and the write states of verify targets assigned to the loops, and "O" is indicated in the portions where the verify read is executed. As illustrated in FIG. 8, the type and number of write states of verify targets can be changed as the program loop progresses. In this example, the sequencer 13 executes a program loop up to 19 times. In each of the 19 program loops, the sequencer 13 executes a verify read for at least one type of state.

Specifically, the "S1" state is set as the verify target in the first to sixth program loops. The "S2" state is set as the verify target in the second to eighth program loops. The "S3" state is set as the verify target in the fourth to tenth program loops. The "S4" state is set as the verify target in the sixth to 12th program loops. The "S5" state is set as the verify target in the eighth to 14th program loops. The "S6" state is set as the verify target in the tenth to 16th program loops. The "S7" state is set as the verify target in the 12th to 19th program loops.

The number of program loops which the semiconductor memory device 1 can execute in one write operation may be any other number. Even if the write is not completed for all states, the sequencer 13 may end the write operation as long as the program loop is executed more than a predetermined number of times. The states of the verify target associated with the number of loops may be different from those mentioned above. The sequencer 13 may omit the verify read, based on the result of the detection operation.

[1-2-2] Details of Program Method

Figure 9:
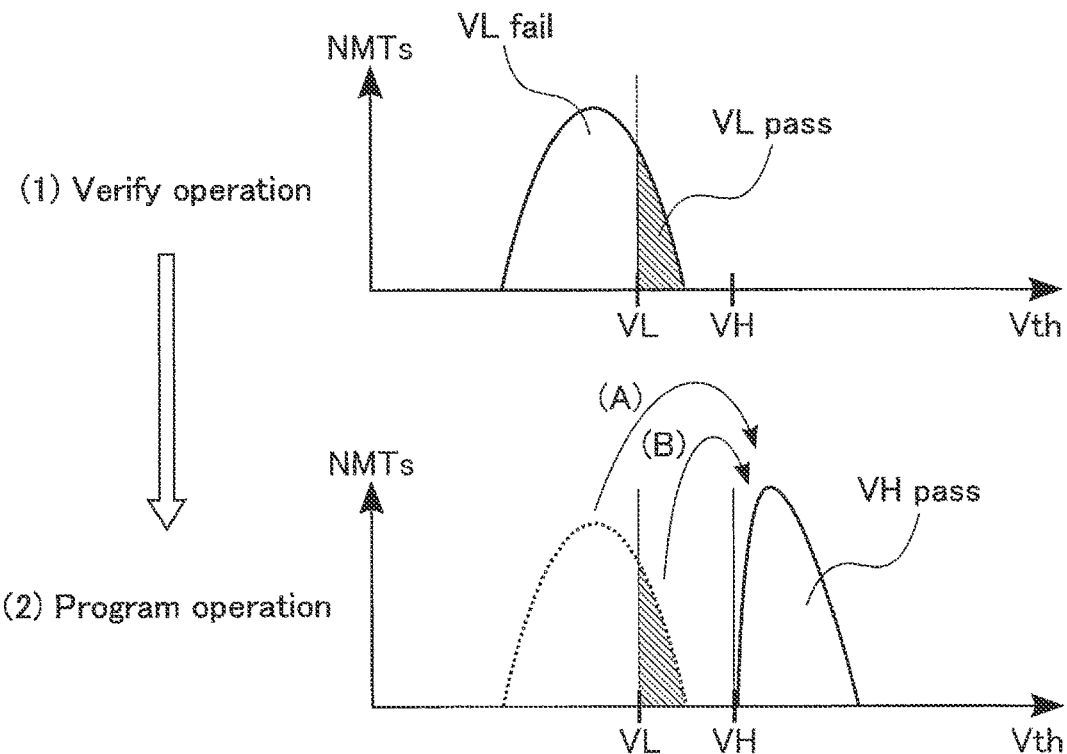
FIG. 9 is a threshold voltage distribution diagram illustrating an example of two verify voltages and two program methods that can be used for write states in the write operation performed in the semiconductor memory device of the first embodiment.

FIG. 9 is a threshold voltage distribution diagram illustrating an example of two verify voltages and two program methods that can be used for write states in the write operation performed in the semiconductor memory device 1 of the first embodiment. FIG. 9(1) and FIG. 9(2) illustrate threshold voltage distributions corresponding to a verify operation and a program operation performed in the same program loop. The write states of the plurality of memory cell transistors MTsel forming the threshold voltage distribution illustrated in FIG. 9 are the same. As illustrated in FIG. 9, in the semiconductor memory device 1 of the first embodiment, a verify low voltage VL and a verify high voltage VH can be set for each write state. The verify high voltage VH is the verify voltage described with reference to FIG. 6. The verify low voltage VL is set to be lower than the verify high voltage VH.

As illustrated in FIG. 9(1), in the verify operation, the sequencer 13 can execute a verify read using the verify low voltage VL (hereinafter referred to as a VL verify) and a verify read using the verify high voltage VH (hereinafter referred to as a VH verify). By such a verify operation, the plurality of memory cell transistors MTsel are classified into MTsel whose threshold voltage is not higher than VL (VL-fail MTsel), MTsel whose threshold voltage is higher than VL and not higher than VH (VL-pass MTsel), and MTsel whose threshold voltage is higher than VH (VH-pass MTsel). In FIG. 9(1), the VL-fail MTsel and the VL-pass MTsel are illustrated.

In the program operation, the sequencer 13 sets each of the VL-fail MTsel and the VL-pass MTsel as program-target, and sets the VH-pass MTsel to program-inhibit. Further, the sequencer 13 applies a first program method to the VL-fail MTsel and applies a second program method to the VL-pass MTsel. When the program operation is executed, as illustrated in FIG. 9(2), the increase in the threshold voltage of the memory cell transistor MTsel to which the second program method is applied (FIG. 9(A)) is smaller than the increase in the threshold voltage of the memory cell transistor MTsel to which the first program method is applied (FIG. 9(B)). As a result, the spread of the threshold voltage distribution formed by the memory cell transistors MTsel that have passed the VH verify is suppressed.

Figure 10:
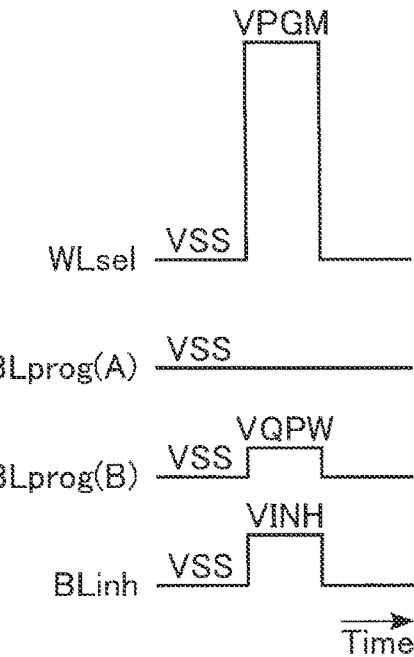
FIG. 10 is a timing chart illustrating an example of a program operation performed in the semiconductor memory device of the first embodiment.

FIG. 10 is a timing chart illustrating an example of a program operation performed in the semiconductor memory device 1 of the first embodiment. FIG. 10 illustrates an example of how the voltage of the word line WLsel changes and how the voltage of the bit line BL changes in the program operation. Hereinafter, the bit line BL coupled to the VL-fail MTsel will be referred to as "bit line BLprog (A)". The bit line BL coupled to the VL-pass MTsel will be referred to as "bit line BLprog(B)" The bit line BL coupled to the program-inhibit memory cell transistor MTsel will be referred to as "bit line BLinh".

As illustrated in FIG. 10, at the start of the program operation, the voltages of the word line WLsel and the bit lines BLprog(A), BLprog(B) and BLinh are VSS, for example. While a program voltage VPGM is being applied to the word line WLsel, a ground voltage VSS is applied to the bit line BLprog(A), a voltage VQPW is applied to the bit line BLprog(B) and a voltage VINH is applied to the bit line BLinh. The voltage VQPW is a voltage higher than VSS. The Voltage VINH is a voltage higher than VPCH.

At this time, in the NAND string NS coupled to the bit line BLprog(A), the select transistor STD is turned on and VSS is applied to the bit line BLprog(A), so that the increase in the channel voltage is suppressed. In the NAND string NS coupled to the bit line BLprog(B), the select transistor STD is turned on, and VQPW is applied to the bit line BLprog(B), so that the channel voltage increases. In the NAND string NS coupled to the bit line BLinh, the select transistor STD is turned off and the channel is set in the floating state.

As a result, in the memory cell transistor MTsel (VL-fail MTsel) coupled to the bit line BLprog(A), the voltage difference between the channel and the control gate increases, so that electrons are injected into the charge storage layer and the threshold value increases. In the memory cell transistor MTsel (VL-pass MTsel) coupled to the bit line BLprog(B), electrons are injected into the charge storage layer, as in the VL-fail MTsel, but the voltage difference between the channel and the control gate is smaller than that of the VL-fail MTsel, and the increase in the threshold voltage is more suppressed than that of the VL-fail MTsel. In the memory cell transistor MTsel (VH-pass MTsel) coupled to the bit line BLinh, the voltage of the channel in the floating state increases in accordance with an increase in the voltage applied to each word line WL, so that the increase in the threshold voltage is more suppressed than that of the VL-pass MTsel.

[1-2-3] Details of Verify Method

FIG. 11 is a table illustrating an example of how a verify voltage is set for the write operation performed in the semiconductor memory device of the first embodiment. As illustrated in FIG. 11, the verify voltage described with reference to FIG. 6 is used as the verify high voltage VH of each write state. Specifically, the verify high voltage VH in the "S1" state is "V1". The verify high voltage VH in the "S2" state is "V2". The verify high voltage VH in the "S3" state is "V3". The verify high voltage VH in the "S4" state is "V4". The verify high voltage VH in the "S5" state is "V5". The verify high voltage VH in the "S6" state is "V6". The verify high voltage VH in the "S7" state is "V7".

On the other hand, the verify high voltage VH in the "S(N−1)" state (N is a number assigned to a write state), that is, a verify voltage V(N−1), is used as the verify low voltage VL of each write state. Specifically, the verify low voltage VL in an "S1" state is undefined in the first embodiment. The verify low voltage VL in the "S2" state is the same "V1" as the verify high voltage VH in the "S1" state. The verify low voltage VL in the "S3" state is the same "V2" as the verify high voltage VH in the "S2" state. The verify low voltage VL in the "S4" state is the same "V3" as the verify high voltage VH in the "S3" state. The verify low voltage VL in the "S5" state is the same "V4" as the verify high voltage VH in the "S4" state. The verify low voltage VL in the "S6" state is the same "V5" as the verify high voltage VH in the "S5" state. The verify low voltage VL in the "S7" state is the same "V6" as the verify high voltage VH in the "S6" state.

FIG. 12 is a timing chart illustrating an example of the verify operation performed in the semiconductor memory device of the first embodiment. FIG. 12 illustrates how the sequencer 13 executes a verify read in the "S(N−1)" state and a verify read in the "S(N)" state in the verify operation. In the present embodiment, "N" is a certain number from 2 to 7. Hereinafter, the bit line BL coupled to the memory cell transistor MTsel whose write state is the "S(N)" state will be referred to as "bit line BLprog (N)".

As illustrated in FIG. 12, at the start of the program operation, the voltages of the word line WLsel and the bit lines BLprog(N−1), BLprog(N) and BLinh are VSS, for example. The sequencer 13 executes the verify operation by appropriately charging the bit lines BL coupled to the verify-target memory cell transistor MTsel.

The bit lines BL for which the verify read is to be executed are charged from VSS to VPCH.

When the verify read in the "S(N−1)" state is performed, the verify voltage V(N−1) is applied to the word line WLsel, and VPCH is applied to the bit lines BLprog(N−1) and BLprog(N). At this time, the sequencer 13 executes a VH verify for the memory cell transistor MTsel coupled to the bit line BLprog(N−1) and a VL verify for the memory cell transistor MTsel coupled to the bit line BLprog(N). The result of the VH verify is stored in the latch circuit VHDL of the sense amplifier unit SAU coupled to the bit line BLprog(N−1), and the result of the VL verify is stored in the latch circuit VLDL of the sense amplifier unit SAU coupled to the bit line BLprog(N).

When the verify read in the "S(N)" state is performed, a verify voltage V(N) is applied to the word line WLsel, and VPCH is applied to the bit line BLprog(N). At this time, the sequencer 13 executes the VH verify for the memory cell transistor MTsel coupled to the bit line BLprog (N). The result of the VH verify is stored in the latch circuit VHDL of the sense amplifier unit SAU coupled to the bit line BLprog(N).

As described above, the sequencer 13 executes the VL verify in the "S(N)" state at the time of the verify read associated with the immediately preceding write state. That is, where the VH verify in the "S(N−1)" state is set in each program loop, the sequencer 13 executes the VH verify in the "S(N−1)" state and the VL verify in the "S(N)" state in parallel.

In the semiconductor memory device 1 of the first embodiment, where the VH verify in the "S(N)" state is set in each program loop and the VH verify in the "S(N−1)" state is not set in each program loop, the VL verify in the "S(N)" state is omitted from the program loop.

Figure 13:
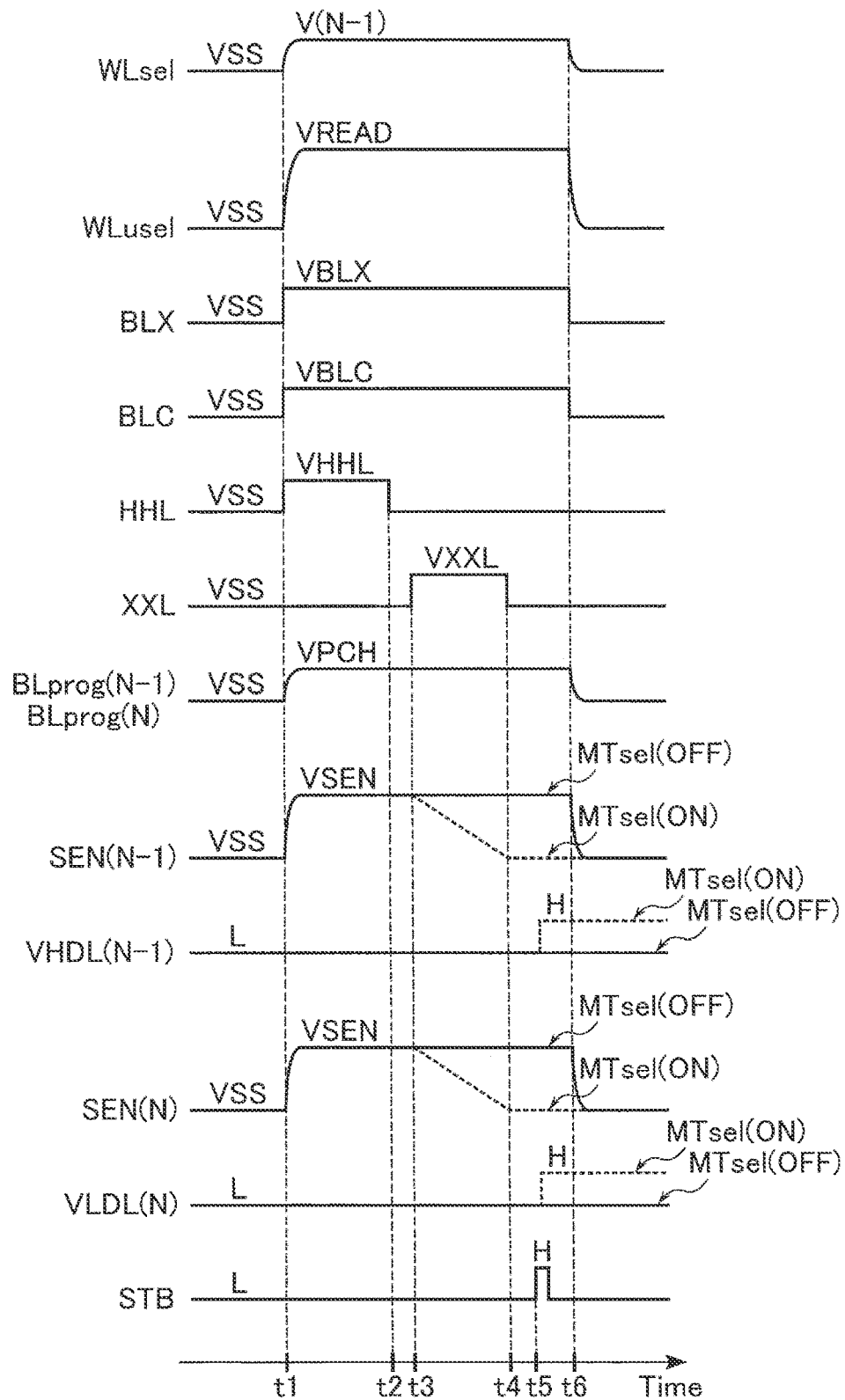
FIG. 13 is a timing chart illustrating a more detailed example of the verify operation performed in the semiconductor memory device of the first embodiment.

FIG. 13 is a timing chart illustrating a more detailed example of the verify operation performed in the semiconductor memory device of the first embodiment. FIG. 13 illustrates a detailed operation performed when the sequencer 13 executes the verify read of the "S(N−1)" state in the verify operation, and illustrates examples of voltages of the word lines WLsel and WLusel, the nodes BLX, BLC, HHL and XXL, the bit lines BLprog(N−1) and BLprog(N), the sense nodes SEN(N−1) and SEN(N) and the control signal STB. The sense node SEN (N) indicates the voltage of the sense node SEN included in the sense amplifier unit SAU coupled to the memory cell transistor MTsel whose write state is the "S(N)" state. VHDL(N−1) corresponds to data stored in the latch circuit VHDL included in the sense amplifier unit SAU coupled to the memory cell transistor MTsel whose write state is the "S(N−1)" state. VLDL(N) corresponds to data stored in the latch circuit VLDL included in the sense amplifier unit SAU coupled to the memory cell transistor MTsel whose write state is the "S(N)" state.

As illustrated in FIG. 13, before the start of the verify operation, the voltages of the word lines WLsel and WLusel, the nodes BLX, BLC, HHL and XXL, the bit lines BLprog (N−1) and BLprog(N) and the sense node SEN are VSS, for example. At this time, in each sense amplifier unit SAU, the transistors 21 to 24 whose gates are applied with VSS are in the OFF state. In the present embodiment, VHDL(N−1) stores "L" level data, and VLDL(N) stores "L" level data. That is, in the verify operation executed in the program loop immediately preceding this program loop, the VH verify in the "S(N−1)" state and the VL verify in the "S(N)" state fail. When the sequencer 13 starts the program operation, the sequencer 13 executes the processes at times t1 to t6 in order.

At time t1, the verify voltage V(N−1) is applied to the word line WLsel, and VREAD is applied to the word line WLusel. By application of the verify voltage V(N−1) to the word line WLsel, the selected memory cell transistor MTsel is turned on or off, and by the application of the verify voltage V(N−1) to the word line WLusel, the unselected memory cell transistor MT is turned on.

Further, at time t1, VBLX is applied to the node BLX, VBLC is applied to the node BLC, and VHHL is applied to the node HHL. Each of VBLX, VBLC and VHLL is a voltage higher than VSS. The transistor 21 whose gate is applied with VBLX, the transistor 24 whose gate is applied with VBLC and the transistor 22 whose gate is applied with VHLL are turned on. Thus, each of the bit lines BLprog(N−1) and BLprog(N) is charged by the current flowing through the transistors 20, 21, 24 and 29, and each of the voltages of the bit lines BLprog(N−1) and BLprog (N) rises from VSS to VPCH. Each of the sense nodes SEN(N−1) and SEN(N) is charged by the current flowing through the transistors 20 and 22, and each of the voltages of the sense nodes SEN(N−1) and SEN(N) rises from VSS to VSEN.

At time t2, VSS is applied to the node HHL. Thus, the transistor 22 whose gate is applied with VSS is turned off, and the current path between the node ND1 and the sense node SEN is shut off. At this time, the sense node SEN is in the floating state and maintains the charged voltage from times t1 to t2.

At time t3, VXXL is applied to the node XXL. VXXL is a voltage higher than VSS. The transistor 23 whose gate is applied with VXXL is turned on. Thus, the voltages of the sense nodes SEN(N−1) and SEN(N) are lowered or maintained in accordance with the state of the associated memory cell transistor MTsel. Specifically, the voltage of the sense node SEN is lowered where the memory cell transistor MTsel to which the verify voltage V(N−1) is applied is in the ON state (FIG. 13, MTsel(ON)), and is maintained where the memory cell transistor MTsel to which the verify voltage V(N−1) is applied is in the OFF state (FIG. 13, MTsel (OFF)). Even where the memory cell transistor MTsel is in the ON state, the voltage lowering rate of the sense node SEN may change, depending on the relationship between the threshold voltage of the memory cell transistor MTsel and the magnitude of the applied verify voltage.

At time t4, VSS is applied to the node XXL. Thus, the transistor 23 whose gate is applied with VSS is turned off, and the current path between the sense node SEN and the node ND2 is shut off. At this time, the sense node SEN is in the floating state and maintains the voltage after the discharge performed from times t3 to t4. In the present specification, the period during which VXXL is kept applied to the node XXL after the sense node SEN is charged (in the present embodiment, the period from time t3 to time t4) is referred to as a "discharge time of sense node SEN".

At time t5, the sequencer 13 asserts a control signal STB. In other words, the sequencer 13 temporarily changes the control signal STB from the "L" level to the "H" level, and causes the sense amplifier module 16 to determine the threshold voltage of the memory cell transistor MTsel. Specifically, the transistor 27 whose gate is applied with the "H" level voltage is turned on, and the voltage of the pre-charged bus LBUS is lowered or maintained in accordance with the state of the transistor 26. For example, where the voltage of the sense node SEN is equal to or higher than the threshold voltage of the transistor 26, the transistor 26 is in the ON state and the voltage of the bus LBUS drops. On the other hand, where the voltage of the sense node SEN is lower than the threshold voltage of the transistor 26, the transistor 26 is in the OFF state and the voltage of the bus LBUS is maintained.

The sequencer 13 stores data that is based on the voltage of the bus LBUS in a predetermined latch circuit. In the present embodiment, the sequencer 13 transfers data that is based on the voltage of the sense node SEN(N−1) to the sense amplifier unit SAU whose write state is the "S(N−1)" state, and causes the latch circuit VHDL(N−1) to store the data. On the other hand, the sequencer 13 transfers data that is based on the voltage of the sense node SEN(N) to the sense amplifier unit SAU whose write state is the "S(N)" state, and causes the latch circuit VHDL(N) to store the data. In the present embodiment, the voltage of each latch circuit is indicated as the "H" level where data corresponding to MTsel(ON) is stored. The voltage of each latch circuit is indicated as the "L" level where data corresponding to MTsel(OFF) is stored.

At time t6, the voltages of the word lines WLsel and WLusel, the nodes BLX, BLC, HHL and XXL, the bit lines BLprog(N−1) and BLprog(N) and the sense node SEN are returned to the states that are before the start of the verify operation. As a result, the sequencer 13 ends the verify operation of the "S(N−1)" state.

As described above, the semiconductor memory device 1 of the first embodiment performs the verify operation of first data (for example, "S(N−1) state") such that a determination of whether the memory cell transistor MT to which the first data is to be written exceeds the verify high voltage (for example, "V(N−1)") of the first data and a determination of whether or not the memory cell transistor MT to which second data (for example, the "S(N) state") is to be written exceeds the verify low voltage (for example, VL(N)=V(N−1)) of the second data are made simultaneously. This "determination" corresponds to asserting the control signal STB by the sequencer 13.

In the semiconductor memory device 1 of the first embodiment, in the verify operation, the sequencer 13 may target a plurality of write states and sequentially execute a verify read similar to the above-mentioned verify read in "S(N−1)" state. Where the verify operation includes only one write state as the target of the verify read, the VL verify using the verify read of the write state may be executed or may be omitted. The VL verify in a certain write state may be executed after the VH verify in the write state is started and where the VH verify in the immediately preceding write state is executed.

[1-3] Advantages of First Embodiment

According to the semiconductor memory device 1 of the first embodiment described above, a decrease in the write speed can be suppressed and the reliability of data can be improved. Detailed advantages of the semiconductor memory device 1 of the first embodiment will be described below.

In the write operation, the semiconductor memory device executes a plurality of program loops, each of which includes a program operation (Program) and a verify operation (Verify). In the semiconductor memory device, the threshold voltage of a write-target memory cell transistor MT is increased by the program voltage applied in the program operation until the threshold voltage has exceeded the target verify voltage applied in the verify operation. An increase amount of the threshold voltage of the write-target memory cell transistor MT depends on the step-up width of the program voltage in the write operation. As a cumulative result of the respective program operations included in the write operation, the threshold voltages of the plurality of memory cell transistors MT have variations close to a normal distribution. The variations in the threshold voltages of the memory cell transistors MT are caused by the variation in the write characteristics of the memory cell transistors MT. Meanwhile, in order to increase the speed of the write operation, it is preferable to increase the step-up width of the program voltage. However, increasing the step-up width of the program voltage may widen the threshold voltage distribution of the memory cell transistor MT.

On the other hand, in the semiconductor memory device 1 of the first embodiment, two kinds of verify voltages (the verify low voltage VL and the verify high voltage VH) are set for each write state, and the increase amount of the threshold voltage is controlled. Briefly speaking, where the memory cell transistor MT has passed the VH verify using the verify high voltage VH, the semiconductor memory device 1 regards the program to the memory cell transistor MT as having been completed, and sets the memory cell transistor MT as write-inhibit in the subsequent program operations. On the other hand, where the memory cell transistor MT has passed the VL verify using the verify low voltage VL, the semiconductor memory device 1 executes the next program operation under a condition where the bit line BL coupled to the memory cell transistor MT is charged.

As a result, in the memory cell transistor MT that has passed the VL verify, the increase amount of the threshold voltage is suppressed as compared with the case of not charging the corresponding bit line BL, and the threshold voltage is prevented from significantly exceeding the verify high voltage VH. As a result, the semiconductor memory device 1 can suppress the spread of the threshold voltage distribution of the memory cell transistor MT even if the step-up width of the program voltage is increased. However, where the verify operation in which the verify low voltage VL and the verify high voltage VH are set is executed for each write state, the number of reads associated with the verify operation increases, and the processing time of the write operation may lengthen.

Therefore, the semiconductor memory device 1 of the first embodiment allocates the same voltage as the verify high voltage VH set in the immediately preceding write state and uses it as the verify low voltage VL. When the semiconductor memory device 1 executes the verify operation in the "S(N−1)" state, the VH verify in the "S(N−1)" state and the VL verify in the "S(N)" state are performed in parallel. Then, the semiconductor memory device 1 adjusts the increase amount of the threshold voltage of the memory cell transistor MT in the subsequent program operations, based on the result of the VL verify executed in parallel with the VH verify in the immediately preceding state.

As described above, the semiconductor memory device 1 of the first embodiment can execute the VL verify without lengthening the processing time of the program operation. In other words, the processing time of the VL verify is hidden by the time of the VH verify. The semiconductor memory device 1 can suppress the spread of the threshold voltage distribution of the memory cell transistor MT by executing the VL verify. As a result, the semiconductor memory device 1 of the first embodiment can suppress a decrease in the write speed and improve the reliability of data.

[1-4] Modifications of First Embodiment

In the semiconductor memory device 1, the setting of the verify low voltage VL for using the second program method is preferably optimized in accordance with the write characteristics of the memory cell transistor MT. Hereinafter, the first and second modifications of the first embodiment will be described in which the setting of the verify low voltage VL is varied.

First Modification of First Embodiment

FIG. 14 is a table illustrating an example of how a verify voltage is set in the first modification of the first embodiment. As illustrated in FIG. 14, as the verify low voltage VL of each write state, the verify high voltage VH of the state that is two states before may be used. In other words, as the verify low voltage VL of each write state, the verify high voltage VH in the "S(N−2)" state, that is, the verify voltage V(N−2), may be used.

Specifically, in the first modification of the first embodiment, the verify low voltage VL of each of the "S1" and "S2" states is undefined, and the verify low voltages VL in the "S3" to "S7" states are voltages V1 to V5, respectively. Even in such a case, the semiconductor memory device 1 of the first modification of the first embodiment can achieve the same advantages as those of the first embodiment. The verify high voltage VH of the state that is three or more states before may be used as the verify low voltage VL in each write state.

Second Modification of First Embodiment

FIG. 15 is a table illustrating an example of how a verify operation is set in the second modification of the first embodiment. As illustrated in FIG. 15, in the allocation of the verify low voltage VL to each write state, the use of the verify high voltage VH of the write state that is one state before and the use of the verify high voltage VH of the state that is two states before are used in a mixed state. In other words, as the verify low voltage VL of each write state, the verify high voltage VH of the "S(N−1)" state and the verify high voltage VH of the "S(N−2)" state can be selectively used.

Specifically, in the second modification of the first embodiment, the verify low voltage VL in the "S1" state is undefined, the verify low voltages VL in the "S2" to "S4" states are V1 to V3, respectively, and the verify low voltage VL in the "S5" to "S7" states are V3 to V5, respectively. Even in such a case, the semiconductor memory device 1 of the second modification of the first embodiment can achieve the same advantages as those of the first embodiment. The verify high voltage VH of the state that is three or more states before may be used as the verify low voltage VL in each write state. The combination of verify low voltages VL can be changed as appropriate.

[2] Second Embodiment

The configurations of the semiconductor memory device 1 according to the second embodiment are similar to those of the first embodiment. The semiconductor memory device 1 of the second embodiment adjusts a substantial verify low voltage by making the sense time in the VL verify longer than that in the VH verify. A description will be given of the points in which the semiconductor memory device 1 of the second embodiment differs from that according to the first embodiment.

[2-1] Verify Method

Figure 16:
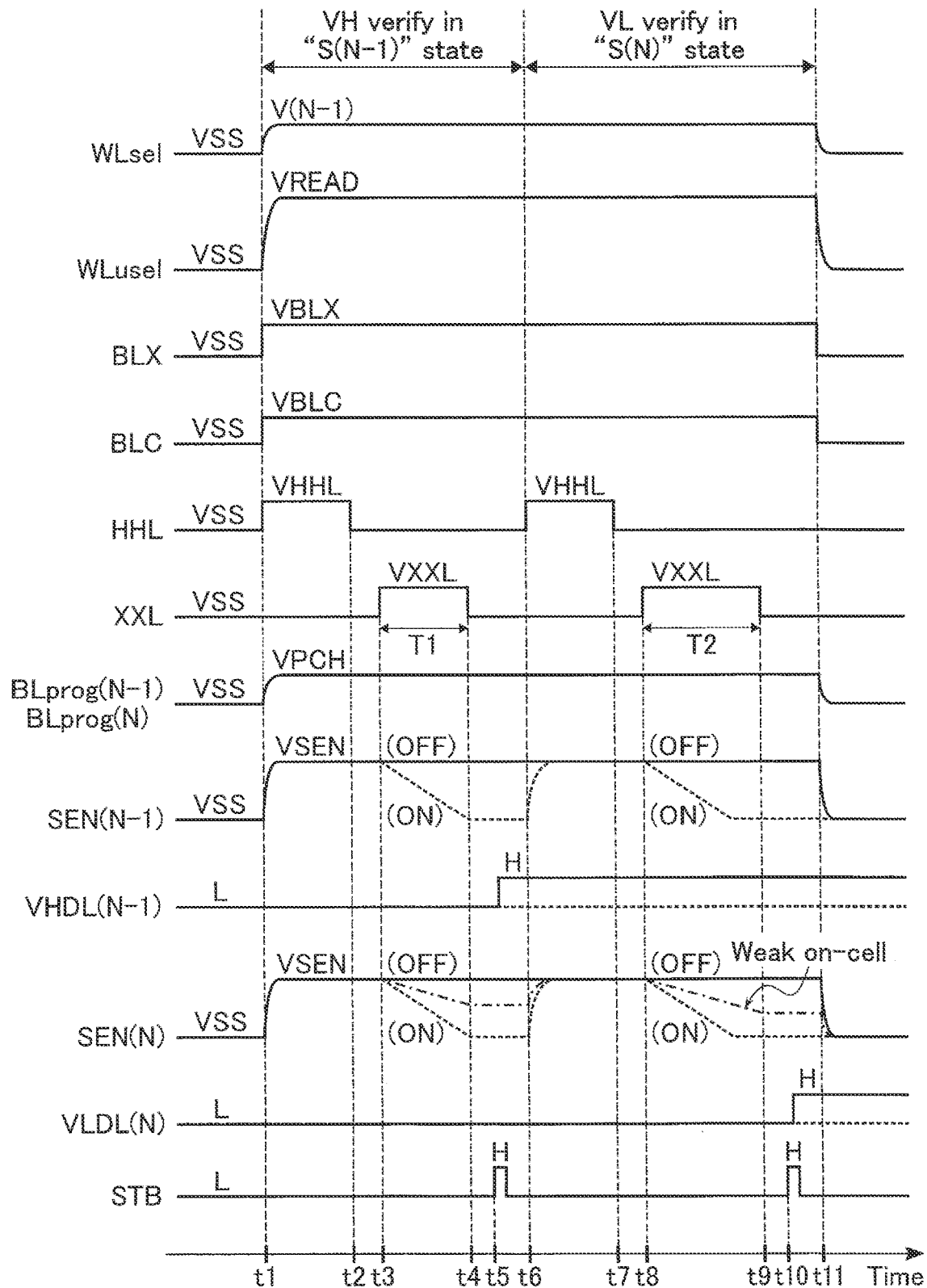
FIG. 16 is a timing chart illustrating an example of a verify operation performed in a semiconductor memory device according to the second embodiment.

FIG. 16 is a timing chart illustrating an example of a verify operation performed in the semiconductor memory device of the second embodiment. FIG. 16 illustrates an example of how voltages change in the verify read in the "S(N−1)" state at the items similar to those of the timing chart illustrated in FIG. 13.

As illustrated in FIG. 16, the state before the start of the verify operation is similar to that of the timing chart illustrated in FIG. 13. When the verify operation is started, the sequencer 13 sequentially executes the processes at times t1 to t11. The period from time t1 to t6 corresponds to the VH verify in the "S(N−1)" state. The period from time t6 to t11 corresponds to the VL verify in the "S(N)" state.

The VH verify in the "S(N−1)" state is similar to the verify read in the "S(N−1)" state described with reference to FIG. 13, except that the operation using the latch circuit VLDL(N) is omitted. The operations from times t1 to t4 are similar to those performed from times t1 to t4 illustrated in FIG. 13. The point is that the verify voltage V(N−1) is applied to the word line WLsel. Each of the bit line BLprog and the sense node SEN is charged. While VXXL is being applied to the node XXL, the voltage of the sense node SEN is lowered or maintained in accordance with the state of the memory cell transistor MTsel. The discharge time of the sense node SEN in this VH verify will be hereinafter referred to as "T1". At time t5, the sequencer 13 asserts a control signal STB and causes the latch circuit VHDL(N−1) to store the result of the VH verify of the "S(N−1)" state.

The VL verify in the "S(N)" state is similar to the verify read in the "S(N−1)" state described with reference to FIG. 13, except that the operation using the latch circuit VLDL (N−1) is omitted. The operations from times t6 to t9 are similar to those performed from times t1 to t4 illustrated in FIG. 13. The point is that the sense node SEN is charged again. While VXXL is being applied to the node XXL, the voltage of the sense node SEN lowers or is maintained in accordance with the state of the memory cell transistor MTsel. The discharge time of the sense node SEN in this VL verify will be hereinafter referred to as "T2". T2 is longer than T1. As a result, where the discharge time of the sense node SEN in the VH verify is T1, a voltage higher than VL(N−1) is substantially used for the VL verify. At time t10, the sequencer 13 asserts a control signal STB and causes the latch circuit VLDL(N) to store the result of the VL verify of the "S(N)" state.

At time t11, the voltages of the word lines WLsel and WLusel, the nodes BLX, BLC, HHL and XXL, the bit lines BLprog(N−1) and BLprog(N) and the sense node SEN are returned to the states that are before the start of the verify operation. As a result, the sequencer 13 ends the verify operation of the "S(N−1)" state.

As described above, the semiconductor memory device 1 of the second embodiment uses the verify high voltage VH of the "S(N−1)" state in the verify operation of the "S(N−1)" state, and the VH verify in the "S(N−1)" state and the VL verify in the "S(N)" state are executed successively. In the second embodiment, the discharge time T2 of the sense node SEN in the VL verify of the "S(N)" state is set to be longer than the discharge time T1 of the sense node SEN in the VH verify of the "S(N−1)" state. Other operations of the semiconductor memory device 1 of the second embodiment are similar to those of the first embodiment. In the second embodiment, the VH verify in the "S(N−1)" state and the VL verify in the "S(N)" state may be interchanged in order.

[2-2] Advantages of Second Embodiment

Figure 17:
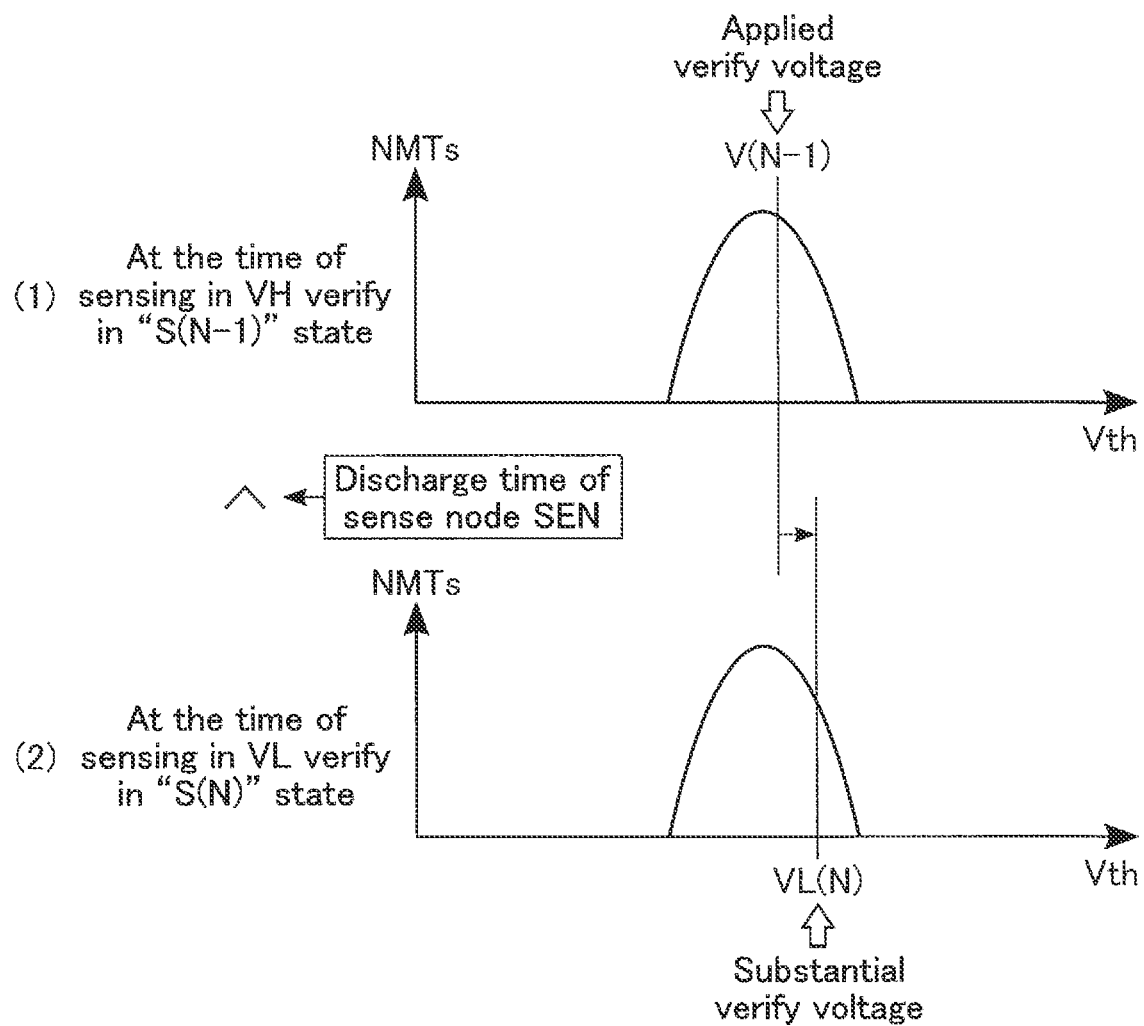
FIG. 17 is a conceptual diagram illustrating an example of a substantial verify voltage used in the semiconductor memory device of the second embodiment.

FIG. 17 is a conceptual diagram illustrating an example of a substantial verify voltage used in the semiconductor memory device 1 of the second embodiment. FIG. 17(1) illustrates a threshold voltage distribution at the time of sensing in the VH verify in the "S(N−1)" state and also illustrates a verify voltage V(N−1) that is applied. FIG. 17(2) illustrates a threshold voltage distribution at the time of sensing in the VL verify in the "S(N)" state and also illustrates a substantial verify voltage. In the present embodiment, the VH verify in the "S(N−1)" state and the VL verify in the "S(N)" state are executed during the verify operation in the "S(N−1)" state.

In order for the threshold voltages of the memory cell transistor MT to be compared between the verify read and the normal read operation under the same conditions, it is preferable that the discharge time of the sense node SEN in the verify read is set to be equal to the discharge time of the sense node SEN in the read operation. On the other hand, in the semiconductor memory device 1 of the second embodiment, the discharge time of the sense node SEN is set to be longer in the VL verify in the "S(N)" state than in the VH verify in the "S(N−1)" state.

As illustrated in FIG. 17(1), the verify voltage V(N−1) is applied to the word line WLsel during the verify operation in the "S(N−1)" state. Where the discharge time of the sense node SEN is set to be longer than that in the VH verify in the "S(N−1)" state, the decrease amount of the voltage of the sense node SEN becomes larger than that in the VH verify in accordance with the threshold voltage of the memory cell transistor MT, just like the voltage change (weak on-cell) of the sense node SEN (N) illustrated in FIG. 16. Such a voltage change of the sense node SEN corresponds to an increase in the verify voltage applied to the word line WLsel, assuming that the discharge time of the sense node SEN is similar to that in the VH verify. That is, as illustrated in FIG. 17(2), in the semiconductor memory device 1 of the second embodiment, the substantial verify voltage used in the VL verify in the "S(N)" state can be regarded as being higher than the verify voltage V(N−1) that is actually applied.

As described above, in the semiconductor memory device 1 of the second embodiment, the verify low voltage VL(N) higher than the verify voltage V(N−1) applied to the word line WLsel can be used for the VL verify. As a result, the semiconductor memory device 1 of the second embodiment can execute a verify operation using a more desirable verify low voltage VL, and can suppress the spread of the threshold voltage distribution of the memory cell transistor MT.

In the semiconductor memory device 1 of the second embodiment, the sense node SEN is charged and discharged and the sense operation is performed in the VH verify of the "S(N−1)" state and in the VL verify of the "S(N)" state. Where read is executed a plurality of times, the processing time of the verify operation tends to be longer than that of the first embodiment. However, the semiconductor memory device 1 of the second embodiment shortens the processing time of the verify operation by executing the verify operation in each write state, with the voltage of the word line WLsel being fixed. The details of the advantages will be described below.

The wiring resistance etc. of the word line WL tend to increase as a result of the high integration such as stacking of memory cells or the like. Changing the voltage of the word line WL is more difficult than changing the voltage applied to each node in the sense amplifier unit SAU. That is, the verify operation time can be long, due to the time required for the voltage change of the word line WL. In contrast, the semiconductor memory device 1 of the second embodiment executes a VH verify and a VL verify, using a common verify voltage during the verify operation. As a result, the semiconductor memory device 1 of the second embodiment does not require the time for increasing the voltage of the word line WL or the time for stabilizing the voltage. Thus, the semiconductor memory device 1 of the second embodiment can shorten the verify operation time, as compared with the case where the voltage of the word line WLsel is changed between the VH verify and the VL verify.

[3] Third Embodiment

The configurations of the semiconductor memory device 1 of the third embodiment are similar to those of the first embodiment. The semiconductor memory device 1 of the third embodiment executes the VL verify and the VH verify, which were described as a set in connection with the second embodiment, by charging the sense node SEN once. A description will be given of the points in which the semiconductor memory device 1 of the third embodiment differs from those of the first and second embodiments.

[3-1] Verify Method

Figure 18:
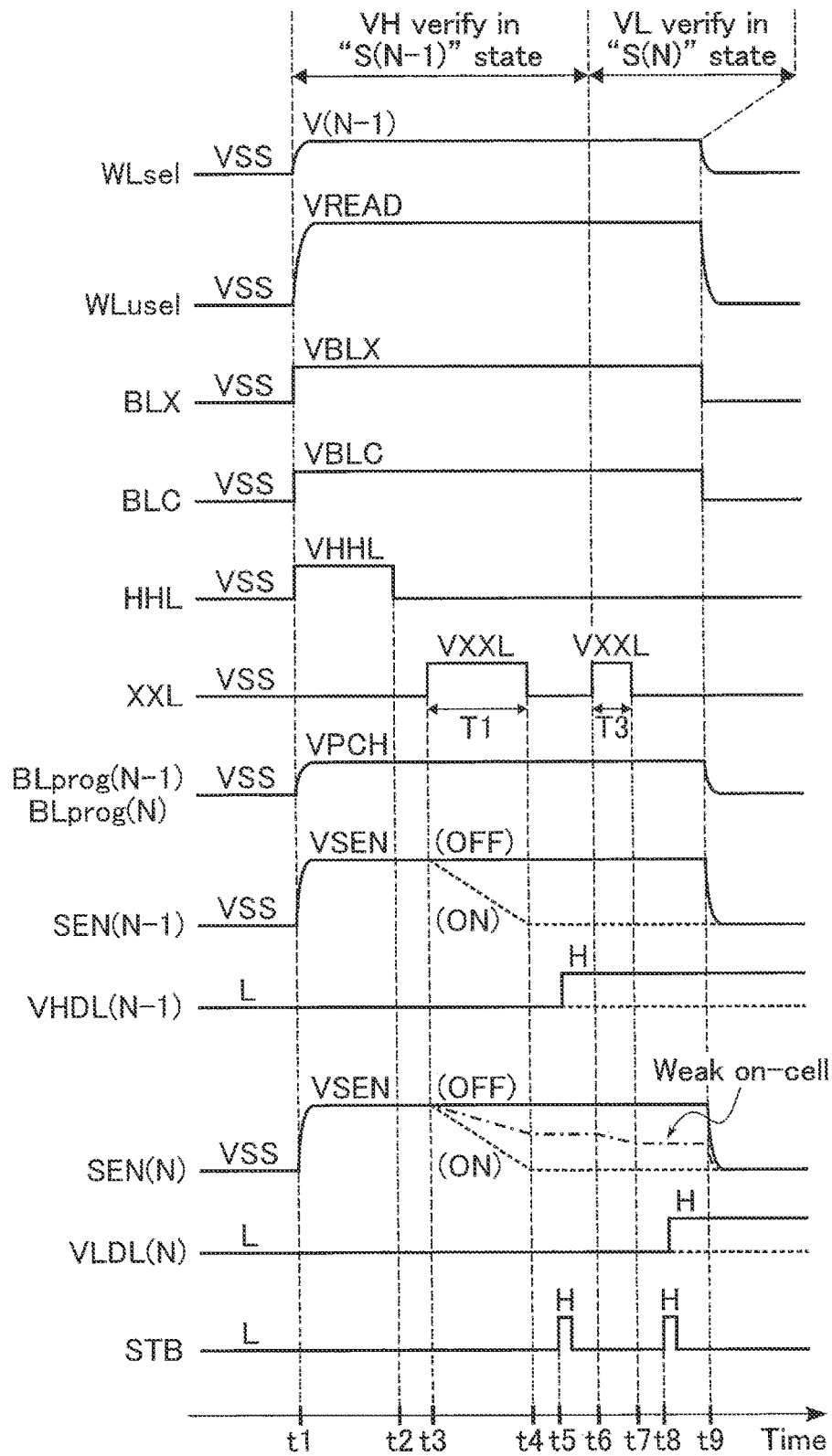
FIG. 18 is a timing chart illustrating an example of how a verify operation is performed in a semiconductor memory device according to the third embodiment.

FIG. 18 is a timing chart illustrating an example of how a verify operation is performed in the semiconductor memory device of the third embodiment. FIG. 18 illustrates an example of how voltages change in the verify read in the "S(N−1)" state at the items similar to those of the timing chart illustrated in FIG. 13.

As illustrated in FIG. 18, the state before the start of the verify operation is similar to that of the timing chart illustrated in FIG. 13. When the verify operation is started, the sequencer 13 sequentially executes the processes at times t1 to t9. The period from time t1 to t6 corresponds to the VH verify in the "S(N−1)" state. The period from time t6 to t9 corresponds to the VL verify in the "S(N)" state.

The VH verify in the "S(N−1)" state is similar to the VH verify in the "S(N−1)" state described with reference to FIG. 16. That is, the operations from times t1 to t5 are similar to those performed from times t1 to t5 illustrated in FIG. 16. The point is that the verify voltage V(N−1) is applied to the word line WLsel. Each of the bit line BLprog and the sense node SEN is charged. While VXXL is being applied to the node XXL, the voltage of the sense node SEN lowers or is maintained in accordance with the state of the memory cell transistor MTsel. The discharge time of the sense node SEN in this VH verify is "T1". The sequencer 13 asserts a control signal STB and causes the latch circuit VHDL(N−1) to store the result of the VH verify of the "S(N−1)" state.

In the third embodiment, charging of the sense node SEN is not performed in the VL verify in the "S(N)" state, which is executed following the VH verify in the "S(N−1)" state. Specifically, at time t6, VXXL is applied to the node XXL and the sense node SEN is discharged. VSS is applied to the node XXL at time t7, and the sense node SEN maintains the voltage after the discharge performed from times t6 to t7. The discharge time of the sense node SEN in this VH verify will be hereinafter referred to as "T3". The sum of T1 and T3 corresponds to the discharge time T2 described in connection with the second embodiment. At time t8, the sequencer 13 asserts the control signal STB and causes the latch circuit VLDL(N) to store the result of the VL verify of the "S(N)" state.

At time t11, the voltages of the word lines WLsel and WLusel, the nodes BLX, BLC, HHL and XXL, the bit lines BLprog(N−1) and BLprog(N) and the sense node SEN are returned to the states that are before the start of the verify operation. As a result, the sequencer 13 ends the verify operation of the "S(N−1)" state. Other operations of the semiconductor memory device 1 of the third embodiment are similar to those of the first embodiment.

[3-2] Advantages of Third Embodiment

As described above, the semiconductor memory device 1 of the third embodiment uses the verify high voltage VH of the "S(N−1)" state in the verify operation of the "S(N−1)" state, and the VH verify in the "S(N−1)" state and the VL verify in the "S(N)" state are executed successively by charging the sense node SEN once. In the third embodiment, the discharge time of the sense node SEN (N) before the sense of the VH verify is set to "T1", as in the second embodiment, and the total discharge time of the sense node SEN(N−1) before the sense of the VL verify is set to T1+T3. That is, in the third embodiment, the discharge time of the sense node SEN in the VL verify of the "S(N)" state is longer than that in the VH verify in the "S(N−1)" state, and the decrease amount of the voltage of the sense node SEN becomes larger than that in the VH verify in accordance with the threshold voltage of the memory cell transistor MT, just like the voltage change (weak on-cell) of the sense node SEN (N) illustrated in FIG. 18.

As a result, in the semiconductor memory device 1 of the third embodiment, as in the second embodiment, the substantial verify voltage in the VL verify of the "S(N)" state can be made higher than the verify high voltage VH applied to the word line WLsel. Further, in the third embodiment, in the VL verify of the "S(N)" state, the charging of the sense node SEN is not performed, and the discharge time of the sense node SEN is shorter than that in the VL verify in the "S(N)" state performed in the second embodiment. Therefore, the semiconductor memory device 1 of the third embodiment achieves the same advantages as the second embodiment, and can shorten the verify operation time as compared with the second embodiment.

[4] Fourth Embodiment

The configurations of the semiconductor memory device 1 of the fourth embodiment are similar to those of the first embodiment. The semiconductor memory device 1 of the fourth embodiment adjusts a substantial verify low voltage by making the sense time in the VL verify shorter than that in the VH verify. A description will be given of the points in which the semiconductor memory device 1 of the fourth embodiment differs from those of the first to third embodiments.

[4-1] Verify Method

Figure 19:
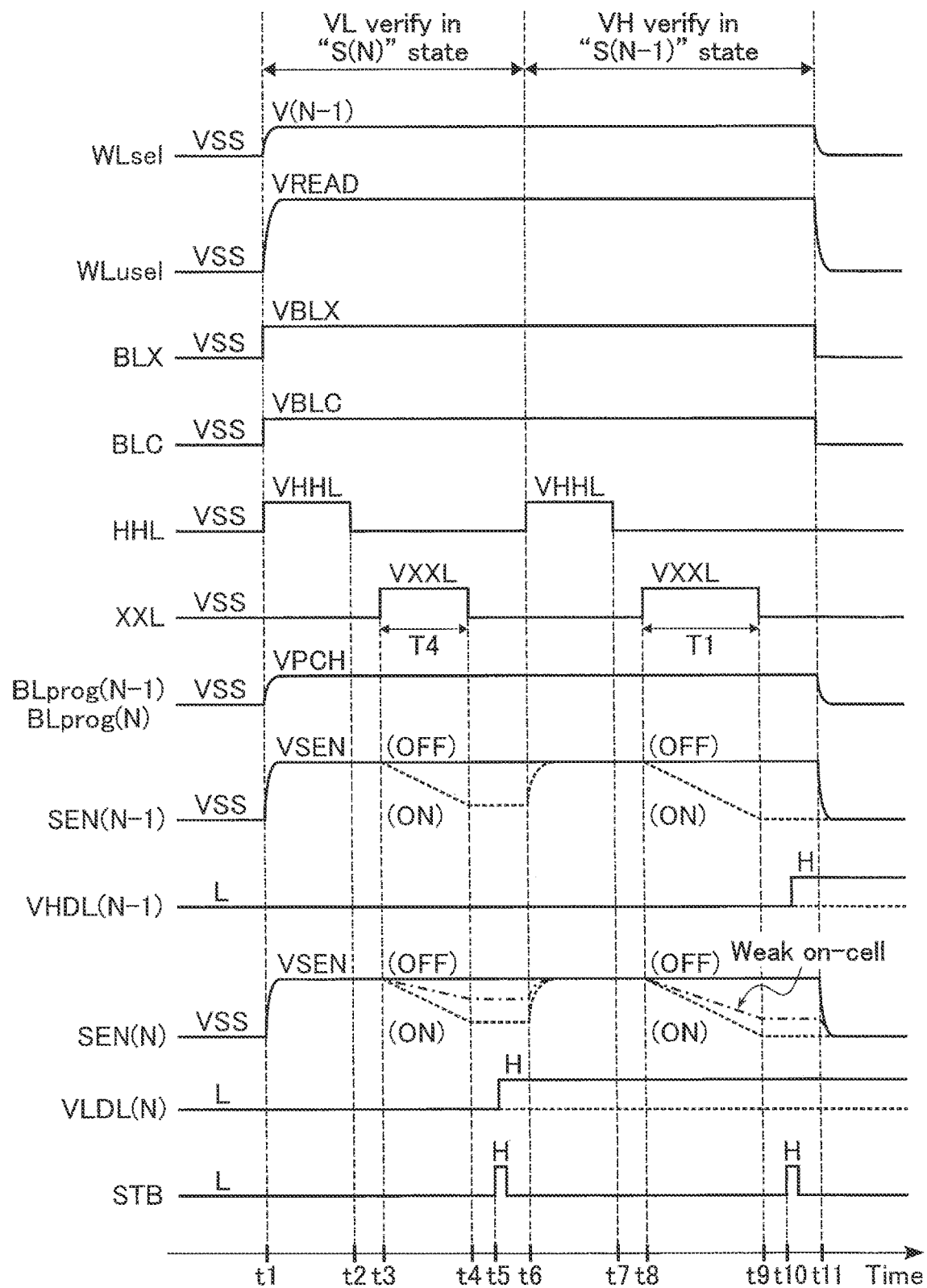
FIG. 19 is a timing chart illustrating an example of a verify operation performed in a semiconductor memory device according to the fourth embodiment.

FIG. 19 is a timing chart illustrating an example of a verify operation performed in the semiconductor memory device of the fourth embodiment. FIG. 19 illustrates an example of how voltages change in the verify read in the "S(N−1)" state at the items similar to those of the timing chart illustrated in FIG. 13.

As illustrated in FIG. 19, the state before the start of the verify operation is similar to that of the timing chart illustrated in FIG. 13. When the verify operation is started, the sequencer 13 sequentially executes the processes at times t1 to t11. The period from time t1 to t6 corresponds to the VL verify in the "S(N)" state. The period from time t6 to t11 corresponds to the VH verify in the "S(N−1)" state.

The VL verify in the "S(N)" state is similar to the verify read in the "S(N−1)" state described with reference to FIG. 13, except that the operation using the latch circuit VHDL (N−1) is omitted. Specifically, the operations from times t1 to t4 are similar to those performed from times t1 to t4 illustrated in FIG. 13. The point is that a verify voltage V(N−1) is applied to the word line WLsel, and each of the bit line BLprog and the sense node SEN is charged. While VXXL is being applied to the node XXL, the voltage of the sense node SEN is lowered or maintained in accordance with the state of the memory cell transistor MTsel. The discharge time of the sense node SEN in this VL verify will be hereinafter referred to as "T4". As a result, in the present embodiment, where the discharge time of the sense node SEN in the VH verify is T1, a voltage lower than V(N−1) is substantially used for the VL verify. At time t5, the sequencer 13 asserts a control signal STB and causes the latch circuit VLDL(N) to store the result of the VL verify of the "S(N)" state.

The VH verify in the "S(N−1)" state is similar to the verify read in the "S(N−1)" state described with reference to FIG. 13, except that the operation using the latch circuit VLDL(N−1) is omitted. The operations from times t6 to t9 are similar to those performed from times t1 to t4 illustrated in FIG. 13. The point is that the sense node SEN is charged again. While VXXL is being applied to the node XXL, the voltage of the sense node SEN is lowered or maintained in accordance with the state of the memory cell transistor MTsel. The discharge time of the sense node SEN in this VH verify is "T1". T1 is longer than T4. At time t10, the sequencer 13 asserts a control signal STB and causes the latch circuit VHDL(N−1) to store the result of the VH verify of the "S(N−1)" state.

At time t11, the voltages of the word lines WLsel and WLusel, the nodes BLX, BLC, HHL and XXL, the bit lines BLprog(N−1) and BLprog(N) and the sense node SEN are returned to the states that are before the start of the verify operation. As a result, the sequencer 13 ends the verify operation of the "S(N−1)" state. Other operations of the semiconductor memory device 1 of the fourth embodiment are similar to those of the first embodiment. In the fourth embodiment, the VL verify in the "S(N)" state and the VH verify in the "S(N−1)" state may be interchanged in order.

As described above, the semiconductor memory device 1 of the fourth embodiment uses the verify high voltage VH of the "S(N−1)" state in the verify operation of the "S(N−1)" state, and the VL verify in the "S(N)" state and the VH verify in the "S(N−1)" state are executed successively. In the fourth embodiment, the discharge time T4 of the sense node SEN in the VL verify of the "S(N)" state is set to be shorter than the discharge time T1 of the sense node SEN in the VH verify of the "S(N−1)" state. Other operations of the semiconductor memory device 1 of the fourth embodiment are similar to those of the first embodiment.

[4-2] Advantages of Fourth Embodiment

FIG. 20 is a conceptual diagram illustrating an example of a substantial verify voltage used in the semiconductor memory device 1 of the fourth embodiment. FIG. 20(1) illustrates a threshold voltage distribution at the time of sensing in the VH verify in the "S(N−1)" state and also illustrates a verify voltage V(N−1) that is applied. FIG. 20(2) illustrates a threshold voltage distribution at the time of sensing in the VL verify in the "S(N)" state and also illustrates a substantial verify voltage. In the present embodiment, the VH verify in the "S(N−1)" state and the VL verify in the "S(N)" state are executed during the verify operation in the "S(N−1)" state. In the semiconductor memory device 1 of the fourth embodiment, the discharge time of the sense node SEN is set to be shorter in the VL verify in the "S(N)" state than in the VH verify in the "S(N−1)" state.

As illustrated in FIG. 20(1), the verify voltage V(N−1) is applied to the word line WLsel during the verify operation in the "S(N−1)" state. Where the discharge time of the sense node SEN is set to be shorter than that in the VH verify in the "S(N−1)" state, the decrease amount of the voltage of the sense node SEN becomes small in accordance with the threshold voltage of the memory cell transistor MT, just like the voltage change (weak on-cell) of the sense node SEN (N) illustrated in FIG. 19. Such a voltage change of the sense node SEN corresponds to a decrease in the verify voltage applied to the word line WLsel, assuming that the discharge time of the sense node SEN is similar to that in the VH verify. That is, as illustrated in FIG. 20(2), in the semiconductor memory device 1 of the fourth embodiment, the substantial verify voltage used in the VL verify in the "S(N)" state can be regarded as being lower than the verify voltage V(N−1) that is actually applied.

As described above, in the semiconductor memory device 1 of the fourth embodiment, the verify low voltage VL(N) lower than the verify voltage V(N−1) applied to the word line WLsel can be used for the VL verify. As a result, the semiconductor memory device 1 of the fourth embodiment can execute a verify operation using a more desirable verify low voltage VL, and can suppress the spread of the threshold voltage distribution of the memory cell transistor MT.

Further, the semiconductor memory device 1 of the fourth embodiment executes a VH verify and a VL verify while a common verify voltage is applied, as in the second embodiment. Therefore, in the semiconductor memory device 1 of the fourth embodiment, the time for the voltage change of the word line WL is not required between the VL verify and the VH verify, as in the second embodiment, and the processing time of the verify operation can be shortened.

[5] Fifth Embodiment

The configurations of the semiconductor memory device 1 of the fifth embodiment are similar to those of the first embodiment. The semiconductor memory device 1 of the fifth embodiment executes the VL verify and the VH verify, which were described as a set in connection with the fourth embodiment, by charging the sense node SEN once. A description will be given of the points in which the semiconductor memory device 1 of the fifth embodiment differs from those of the first to fourth embodiments.

[5-1] Verify Method

Figure 21:
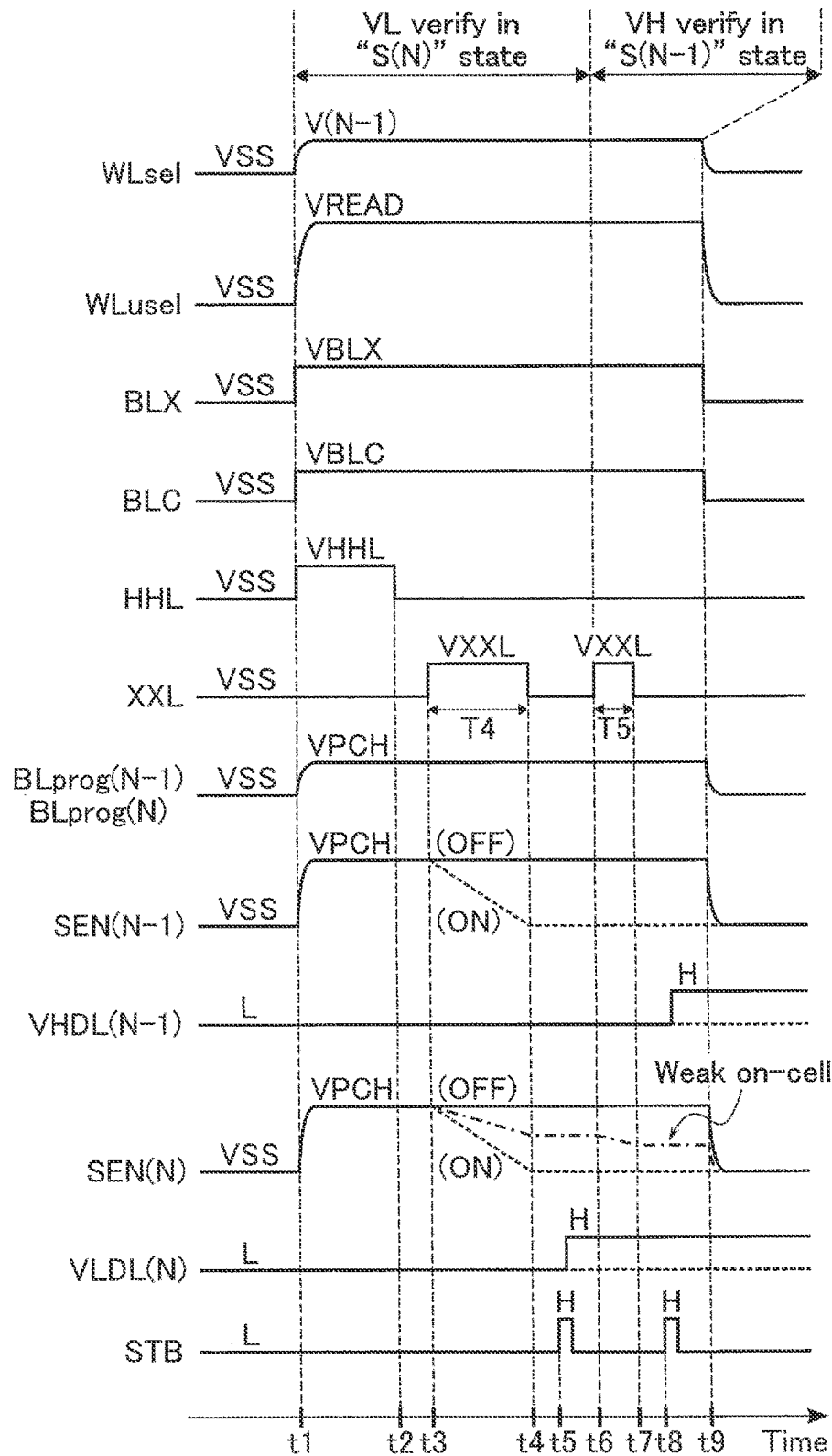
FIG. 21 is a timing chart illustrating an example of how a verify operation is performed in a semiconductor memory device according to the fifth embodiment.

FIG. 21 is a timing chart illustrating an example of how a verify operation is performed in the semiconductor memory device 1 of the fifth embodiment. FIG. 21 illustrates a detailed operation performed when the sequencer 13 executes a verify read of the "S(N−1)" state in the verify operation, and illustrates an example of how voltages change at the items similar those in the timing chart illustrated in FIG. 13.

As illustrated in FIG. 21, the state before the start of the program operation is similar to that of the timing chart illustrated in FIG. 13. When the verify operation is started, the sequencer 13 sequentially executes the processes at times t1 to t9. The period from time t1 to t6 corresponds to the VL verify in the "S(N)" state. The period from time t6 to t9 corresponds to the VH verify in the "S(N−1)" state.

The VL verify in the "S(N)" state is similar to the VL verify in the "S(N−1)" state described with reference to FIG. 19. That is, the operations from times t1 to t5 are similar to those performed from times t1 to t5 illustrated in FIG. 19. The point is that the verify voltage V(N−1) is applied to the word line WLsel. Each of the bit line BLprog and the sense node SEN is charged. While VXXL is being applied to the node XXL, the voltage of the sense node SEN is lowered or maintained in accordance with the state of the memory cell transistor MTsel. The sequencer 13 asserts a control signal STB and causes the latch circuit VHDL(N−1) to store the result of the VH verify of the "S(N−1)" state.

In the third embodiment, charging of the sense node SEN is not performed in the VL verify in the "S(N)" state, which is executed following the VH verify in the "S(N−1)" state. Specifically, at time t6, VXXL is applied to the node XXL and the sense node SEN is discharged. VSS is applied to the node XXL at time t7, and the sense node SEN maintains the voltage after the discharge performed from times t6 to t7. The discharge time of the sense node SEN in this VH verify will be hereinafter referred to as "T5". The sum of T4 and T5 corresponds to the discharge time T1. At time t8, the sequencer 13 asserts a control signal STB and causes the latch circuit VLDL(N) to store the result of the VL verify of the "S(N)" state.

At time t11, the voltages of the word lines WLsel and WLusel, the nodes BLX, BLC, HHL and XXL, the bit lines BLprog(N−1) and BLprog(N) and the sense node SEN are returned to the states that are before the start of the verify operation. As a result, the sequencer 13 ends the verify operation of the "S(N−1)" state. Other operations of the semiconductor memory device 1 of the fifth embodiment are similar to those of the first embodiment.

[5-2] Advantages of Fifth Embodiment

As described above, the semiconductor memory device 1 of the fifth embodiment uses the verify high voltage VH of the "S(N−1)" state in the verify operation of the "S(N−1)" state, and the VH verify in the "S(N−1)" state and the VL verify in the "S(N)" state are executed successively by charging the sense node SEN once. In the fifth embodiment, the discharge time of the sense node SEN (N) before the sense of the VL verify is set to "T4", as in the fourth embodiment, and the total discharge time of the sense node SEN(N−1) before the sense of the VH verify is set to "T4+T5=T1". That is, in the fifth embodiment, the discharge time of the sense node SEN in the VL verify of the "S(N)" state is shorter than that in the VH verify of the "S(N−1)" state, and the decrease amount of the voltage of the sense node SEN(N) before the sensing in the VL verify becomes smaller than that in the VH verify, just like the voltage change (weak on-cell) of the sense node SEN (N) illustrated in FIG. 21.

As a result, in the semiconductor memory device 1 of the fifth embodiment, the substantial verify voltage in the VL verify of the "S(N)" state can be made lower than the verify high voltage VH applied to the word line WLsel, as in the fourth embodiment. Further, in the fifth embodiment, in the VH verify of the "S(N−1)" state, the charging of the sense node SEN is not performed, and the discharge time of the sense node SEN is shorter than that in the VH verify of the "S(N)" state performed in the fourth embodiment. Therefore, the semiconductor memory device 1 of the fifth embodiment achieves the same advantages as the fourth embodiment, and can shorten the verify operation time as compared with the fourth embodiment.

[6] Sixth Embodiment

The configurations of the semiconductor memory device 1 of the sixth embodiment are similar to those of the first embodiment. The semiconductor memory device 1 of the sixth embodiment starts using a second program method, based on a predetermined condition, where the verify read in the write state which is one state before a verify-target state is not executed. A description will be given of the points in which the semiconductor memory device 1 of the sixth embodiment differs from those of the first to fifth embodiments.

[6-1] Program Method

Figure 22:
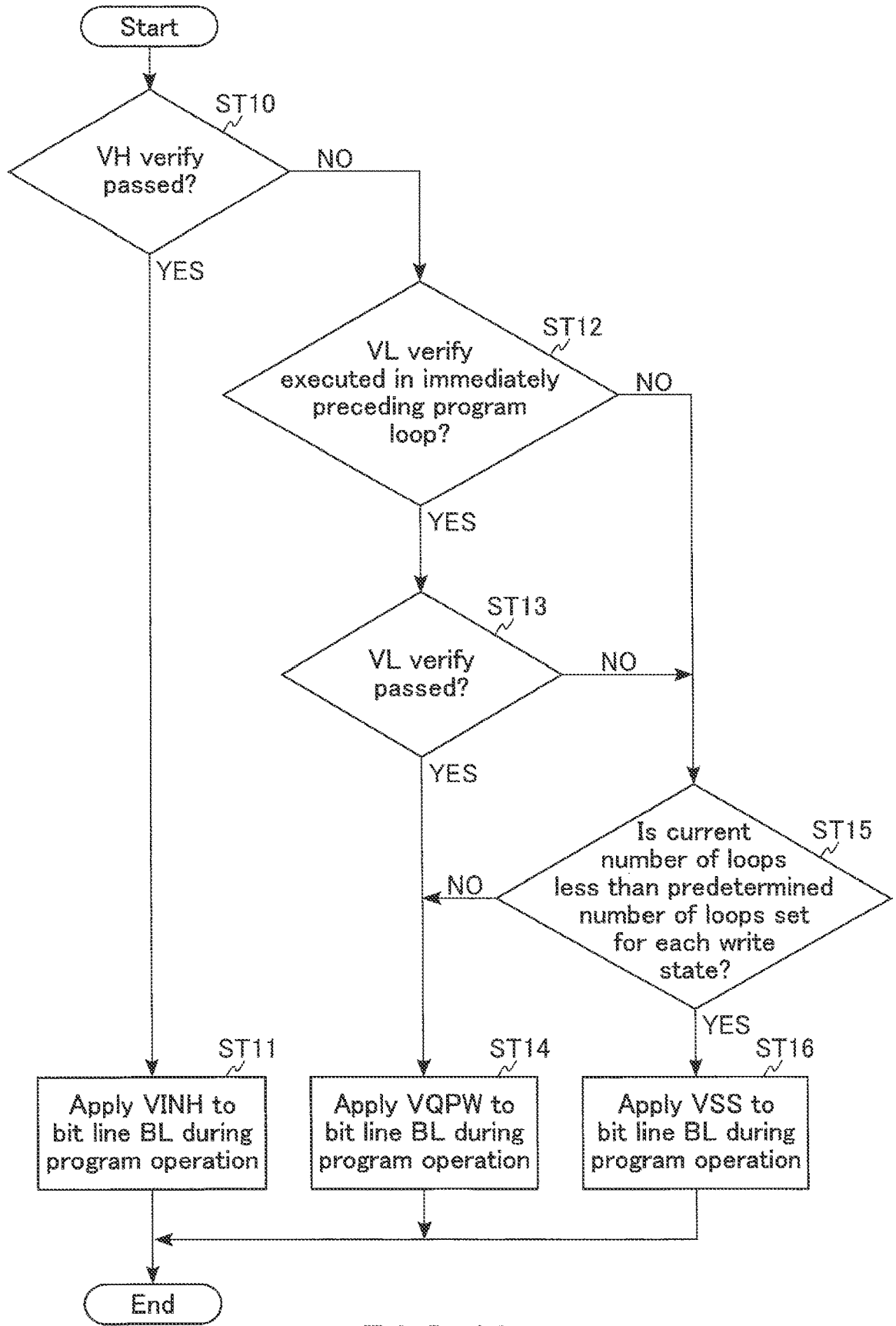
FIG. 22 is a flowchart illustrating an example of how a program operation is performed in a semiconductor memory device according to the sixth embodiment.

FIG. 22 is a flowchart illustrating an example of how a program operation is performed in the semiconductor memory device 1 of the sixth embodiment. As illustrated in FIG. 22, a voltage applied to each bit line BL in the program operation is determined for each program loop. The operation described below is executed by the sequencer 13 and the sense amplifier unit SAU.

First, a plurality of memory cell transistors MTsel are classified according to whether or not they have passed the VH verify (ST10).

Where the VH verify is passed (ST10, YES), the sense amplifier unit SAU applies VINH to the bit line BL coupled to the memory cell transistors MTsel of the group, during the program operation (ST11). That is, the memory cell transistors MTsel of the group are set as write-inhibit.

Where the VH verify is not passed (ST10, NO), the memory cell transistors MTsel of the group are classified according to whether or not the VL verify is executed in the immediately preceding program loop (ST12).

Where the VL verify is executed in the immediately preceding program loop (ST12, YES), the memory cell transistors MTsel of the group are classified based on whether or they have passed the VL verify (ST13).

Where the VL verify is not executed in the immediately preceding program loop (ST12, NO), the process proceeds to ST15.

Where the VL verify is passed (ST13, YES), the sense amplifier unit SAU applies VQPW to the bit line BL coupled to the memory cell transistors MTsel of the group, during the program operation (ST14). That is, the memory cell transistors MTsel of the group are set as program-target, and the second program method is further applied.

Where the VL verify is not passed (ST13, NO), the process proceeds to ST15.

In ST15, it is confirmed whether or not the current number of loops is less than a predetermined number of loops set for each write state. In other words, the number of loops used for the processing of ST15 is set for each write state, and it is confirmed whether or not the current number of loops is less than the number of loops set for each write state.

Where the number of loops is less than the number of loops set for each write state, the sense amplifier unit SAU applies VQPW to the bit line BL coupled to the memory cell transistor MTsel of the group, during the program operation (ST14). That is, the memory cell transistors MTsel of the group is set as program-target, and the second program method is further applied.

Where the number of loops is equal to or greater than the predetermined number of loops set for each write state, the sense amplifier unit SAU applies VSS to the bit line BL coupled to the memory cell transistor MTsel of the group, during the program operation (ST16). That is, the memory cell transistors MTsel of the group are set as program-target, and the first program method is further applied. Other operations of the semiconductor memory device 1 of the sixth embodiment are similar to those of the first embodiment.

[6-2] Advantages of Sixth Embodiment

As described above, the semiconductor memory device 1 of the sixth embodiment executes a program operation using the second program method, based on a predetermined condition, where the verify operation of the immediately preceding write state is not executed in the immediately preceding program loop, that is, where the VL verify is not executed. In other words, the semiconductor memory device 1 of the sixth embodiment can determine whether or not to apply the second program method regardless of whether the VL verify is passed.

As a result, the semiconductor memory device 1 of the sixth embodiment can reduce the number of times a verify read is performed in the verify operation, so that the processing time of the write operation can be shortened. Further, the semiconductor memory device 1 of the sixth embodiment applies the second program method to the memory cell transistors MT that do not pass the VL verify during the program loop in which the VL verify is executed. Therefore, the spread of the threshold voltage distribution of the memory cell transistor MT can be suppressed.

[6-3] Modification of Sixth Embodiment

Figure 23:
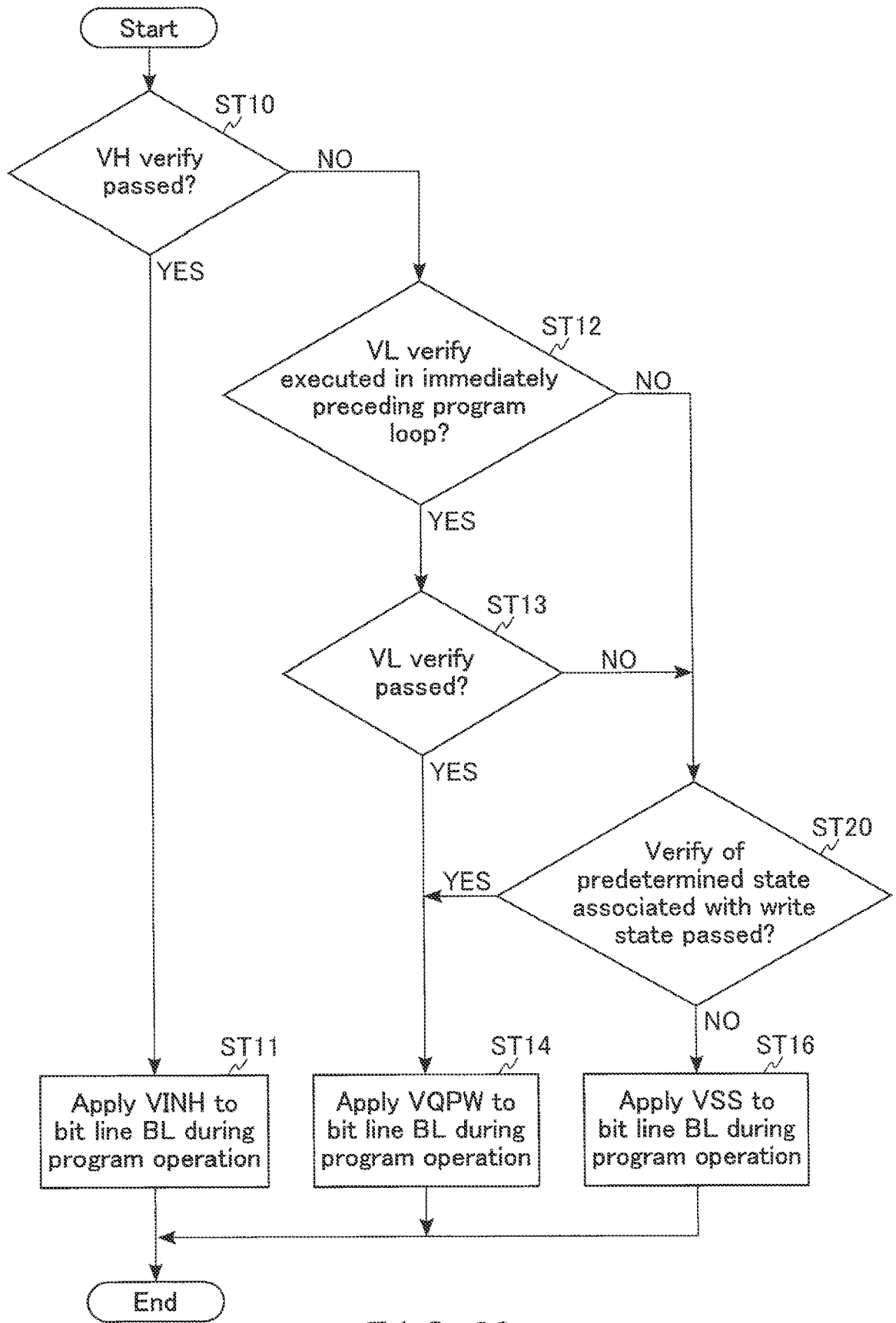
FIG. 23 is a flowchart illustrating an example of how a program operation is performed in the modification of the sixth embodiment.

FIG. 23 is a flowchart illustrating an example of how the program operation is performed in the modification of the sixth embodiment. The flowchart illustrated in FIG. 23 is similar to the flowchart of FIG. 22, except that ST15 is replaced with ST20. In ST20, it is confirmed whether or not the memory cell transistors MTsel of the group have passed the verify of the predetermined state associated with the write state. This predetermined state is one of the states in which the threshold voltage is lower than the write state.

Where the verify of the predetermined state associated with the write state is passed (ST20, YES), the sense amplifier unit SAU applies VQPW to the bit line BL coupled to the memory cell transistor MTsel of the group during the program operation (ST14). That is, the memory cell transistors MTsel of the group is set as program-target, and the second program method is further applied.

Where the verify of the predetermined state associated with the write state is not passed (ST20, NO), the sense amplifier unit SAU applies VSS to the bit line BL coupled to the memory cell transistor MTsel of the group, during the program operation (ST16). That is, the memory cell transistors MTsel of the group is set as program-target, and the first program method is further applied. Other operations in the modification of the sixth embodiment are similar to those of the sixth embodiment.

As described above, where the VL verify is omitted, the conditions under which the second program method is used may be changed. In the modification of the sixth embodiment, whether or not the verify of a predetermined state is passed is used as a trigger, but this is not restrictive. For example, the second program method may be applied based on the fact that the number of memory cell transistors MTsel having passed the verify read of a predetermined state exceeds a predetermined number.

[7] Seventh Embodiment

The configurations of the semiconductor memory device 1 of the seventh embodiment are similar to those of the first embodiment. The semiconductor memory device 1 of the seventh embodiment adds a VL verify of a verify-target state, where the verify read in the write state which is immediately preceding the verify-target state is not executed. A description will be given of the points in which the semiconductor memory device 1 of the seventh embodiment differs from those of the first to sixth embodiments.

[7-1] Verify Method

Figures 24, 25:
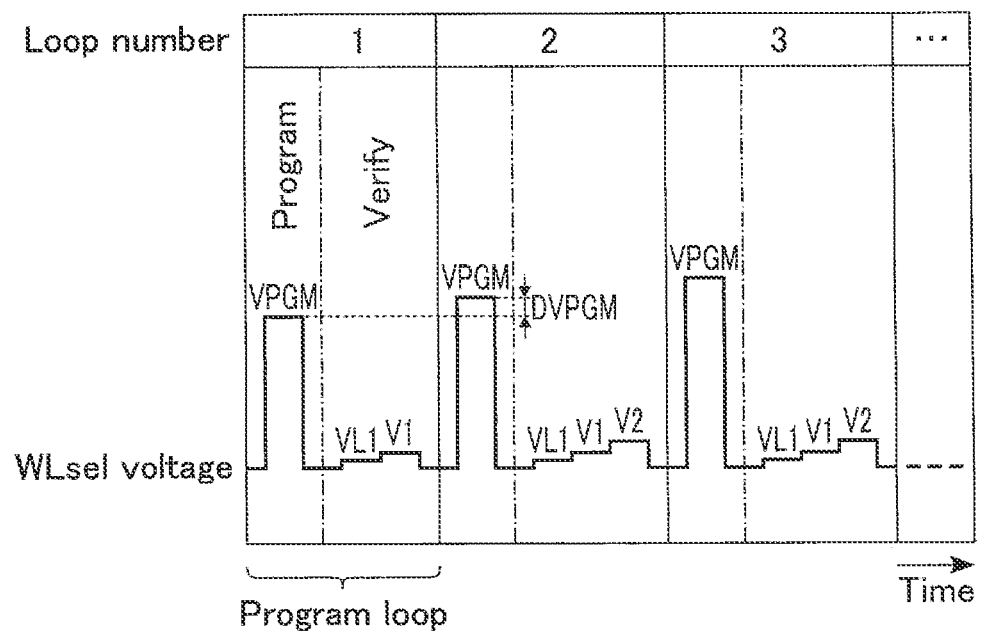
FIG. 24 is a table illustrating an example of how a verify voltage is set in a write operation performed in a semiconductor memory device according to the seventh embodiment.
FIG. 25 is a timing chart illustrating an example of how a write operation is performed in the semiconductor memory device of the seventh embodiment.

FIG. 24 is a table illustrating an example of how a verify operation is performed in the write operation performed in the semiconductor memory device 1 of the seventh embodiment. As illustrated in FIG. 14, the verify voltage described with reference to FIG. 6 is used as the verify high voltage VH of each write state in the seventh embodiment, as in the first embodiment. In the seventh embodiment, a verify low voltage VL1 is set as the verify low voltage VL in the "S1" state. The verify low voltage VL1 is a voltage lower than V1. How the verify low voltage VL is set for the other write states in the seventh embodiment is similar to that of the first embodiment.

FIG. 25 is a timing chart illustrating an example of how a write operation is performed in the semiconductor memory device 1 of the seventh embodiment. FIG. 25 illustrates the number of loops and a WLsel voltage. As illustrated in FIG. 25, the verify read of the "S1" state is executed in each of the first to third program loops. In the verify read of the "S1" state, a verify low voltage VL1 and a verify voltage V1 are applied to the word line WLsel. In this manner, the sequencer 13 executes both the VL verify in the "S1" state and the VH verify in the "S1" state during the verify operation. Other operations of the semiconductor memory device 1 of the seventh embodiment are similar to those of the first embodiment.

[7-2] Advantages of Seventh Embodiment

As described above, the semiconductor memory device 1 of the seventh embodiment adds an freely designed verify low voltage VL where a verify operation of the immediately preceding write state is not performed. As a result, the semiconductor memory device 1 of the seventh embodiment can execute the VL verify even in the write operation of the write state before which a write state does not exist, such as the "S1" state. The semiconductor memory device 1 of the sixth embodiment can suppress the spread of the threshold voltage distribution in the "S1" state by using the second program method that is based on the result of VL verify, and can therefore improve the reliability of data.

[7-3] Modification of Seventh Embodiment

FIG. 26 is a table illustrating an example of how the a verify operation is set in the modification of the seventh embodiment. As illustrated in FIG. 26, where a data write operation of a special pattern is executed, the program operation and the verify operation of some write states may be omitted. In this example, "S1", "S3", "S5" and "S7" states are set as write states, and the write of data assigned to the other states is omitted. In this case, in the "S1", "S3", "S5" and "S7" states, the verify operation of the immediately preceding write state is not executed.

In the modification of the seventh embodiment, therefore, a verify low voltage VL is set in each of the "S1", "S3", "S5" and "S7" states. Specifically, "VL1" is set as the verify low voltage VL in the "S1" state, "VL3" is set as the verify low voltage VL in the "S3" state, "VL5" is set as the verify low voltage VL in the "S5" state, and "VL7" is set as the verify low voltage VL in the "S7" state. VL1 is lower than V1. VL3 is lower than V3. VL5 is lower than V5. VL7 is lower than V7.

The sequencer 13 executes a VL verify using these verify low voltages VL, for example, in a verify operation including the VH verify of the associated write state. In this manner, where a verify operation of the write state used as the verify low voltage VL is not executed, the verify low voltage VL for the VL verify may be added. As a result, the semiconductor memory device 1 of the modification of the seventh embodiment can use the second program method and can improve the reliability of data.

[8] Eighth Embodiment

The configurations of the semiconductor memory device 1 of the eighth embodiment are similar to those of the first embodiment. Where a VL verify and a VH verify are executed by charging the sense node SEN once, the semiconductor memory device 1 of the eighth embodiment performs a desired VL verify by a proper combination of a voltage applied to the word line WLsel and a discharge time of the sense node SEN. A description will be given of the points in which the semiconductor memory device 1 of the eighth embodiment differs from those of the first to seventh embodiments.

[8-1] Verify Method

Figure 27:
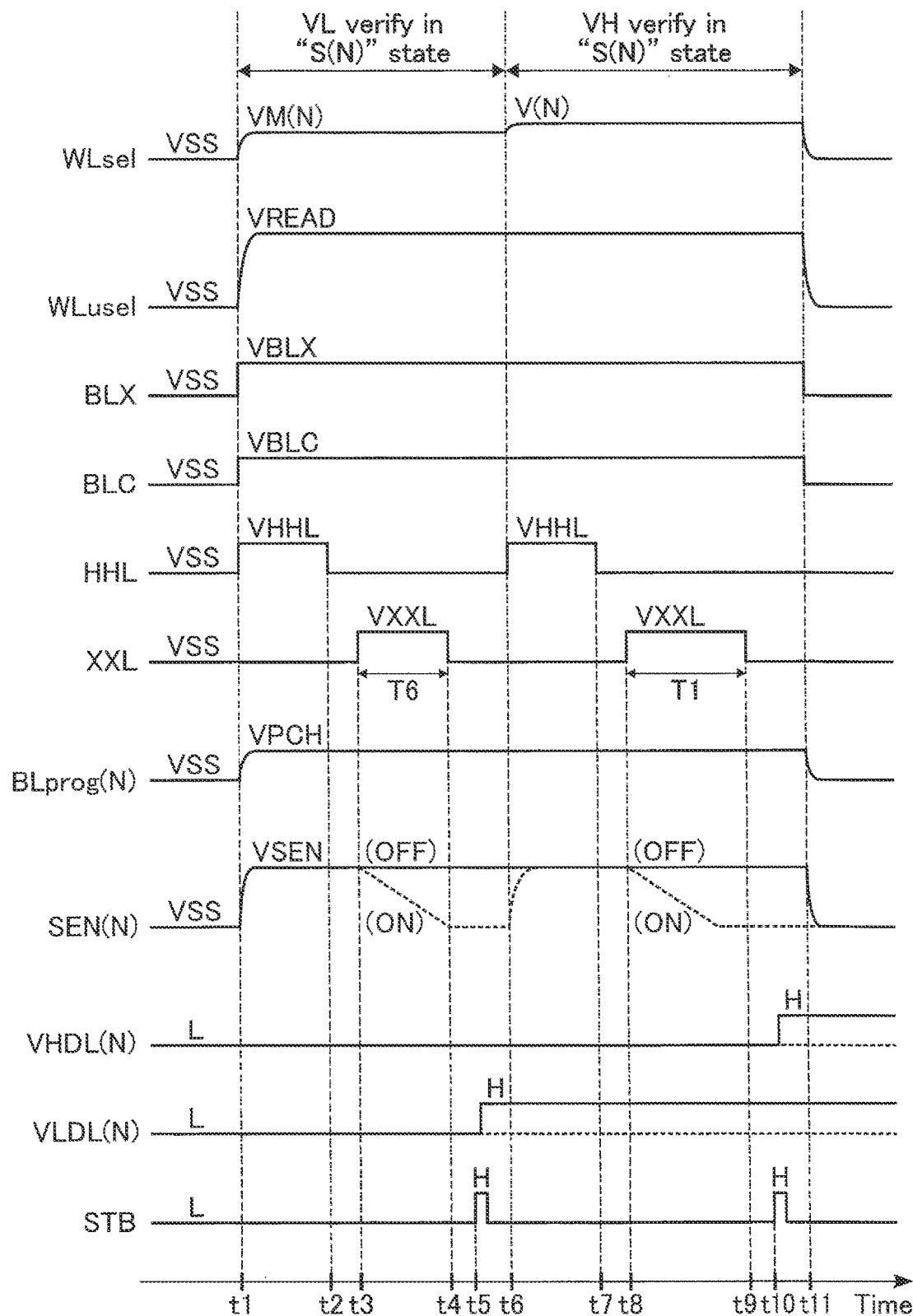
FIG. 27 is a timing chart illustrating an example of how a verify operation is performed in a semiconductor memory device according to the eighth embodiment.

FIG. 27 is a timing chart illustrating an example of how a verify operation is performed in the semiconductor memory device 1 of the eighth embodiment. FIG. 27 illustrates a detailed operation performed when the sequencer 13 executes a verify read of an "S(N)" state in the verify operation, and illustrates examples of voltages of the word lines WLsel and WLusel, the nodes BLX, BLC, HHL and XXL, the bit line BLprog(N), the sense node SEN(N) and the control signal STB. VHDL(N) and VLDL(N) corresponds to data stored in the latch circuits VHDL and VLDL included in the sense amplifier unit SAU coupled to the memory cell transistor MTsel whose write state is the "S(N)" state.

As illustrated in FIG. 27, before the start of the verify operation, the voltages of the word lines WLsel and WLusel, the nodes BLX, BLC, HHL and XXL, the bit lines BLprog (N) and BLprog(N) and the sense node SEN(N) are VSS, for example. Each of VHDL(N) and VLDL(N) stores "L" level data. The period from time t1 to t6 corresponds to the VL verify in the "S(N)" state. The period from time t6 to t11 corresponds to the VH verify in the "S(N)" state.

At time t1, a verify voltage VM(N) is applied to the word line WLsel, VREAD is applied to the word line WLusel, VBLX is applied to the node BLX, VBLC is applied to the node BLC, and VHHL is applied to the node HHL. The verify voltage VM(N) is higher than the verify low voltage VL and lower than the verify high voltage VH. Thus, each of the bit line BLprog and the sense node SEN is charged, as in the first embodiment.

At time t2, VSS is applied to the node HHL. Thus, the sense node SEN is set in the floating state and maintains the charged voltage from times t1 to t2.

At time t3, VXXL is applied to the node XXL. Thus, the voltage of the sense node SEN(N) is lowered or maintained in accordance with the state of the associated memory cell transistor MTsel.

At time t4, VSS is applied to the node XXL. Thus, the discharge path of the sense node SEN is shut off. At this time, the sense node SEN is in the floating state and maintains the voltage after the discharge performed from times t3 to t4. The discharge time of the sense node SEN in this VL verify will be hereinafter referred to as "T6". T6 is shorter than T1. In the present embodiment, where the discharge time of the sense node SEN in the VH verify is T1, VL(N) lower than VM(N−1) is substantially used for the VL verify.

At time t5, the sequencer 13 asserts a control signal STB and causes the latch circuit VHDL(N−1) to store the result of the VL verify of the "S(N)" state.

At time t6, a verify voltage V(N) is applied to the word line WLsel, and VHHL is applied to the node HHL. Thus, each of the bit line BLprog and the sense node SEN is charged, as in the first embodiment.

At time t7, VSS is applied to the node HHL. Thus, the sense node SEN is set in the floating state and maintains the charged voltage from times t6 to t7.

At time t8, VXXL is applied to the node XXL. Thus, the voltage of the sense node SEN(N) is lowered or maintained in accordance with the state of the associated memory cell transistor MTsel.

At time t9, VSS is applied to the node XXL. Thus, the discharge path of the sense node SEN is shut off. At this time, the sense node SEN is in the floating state and maintains the voltage after the discharge performed from times t8 to t9. The discharge time of the sense node SEN in this VH verify is "T1".

At time t10, the sequencer 13 asserts a control signal STB and causes the latch circuit VHDL(N) to store the result of the VH verify of the "S(N)" state.

At time t11, the voltages of the word lines WLsel and WLusel, the nodes BLX, BLC, HHL and XXL, the bit line BLprog(N) and the sense node SEN are returned to the states that are before the start of the verify operation. As a result, the sequencer 13 ends the verify operation of the "S(N)" state. Other operations of the semiconductor memory device 1 of the eighth embodiment are similar to those of the fourth embodiment.

[8-2] Advantages of Eighth Embodiment

Figure 28:
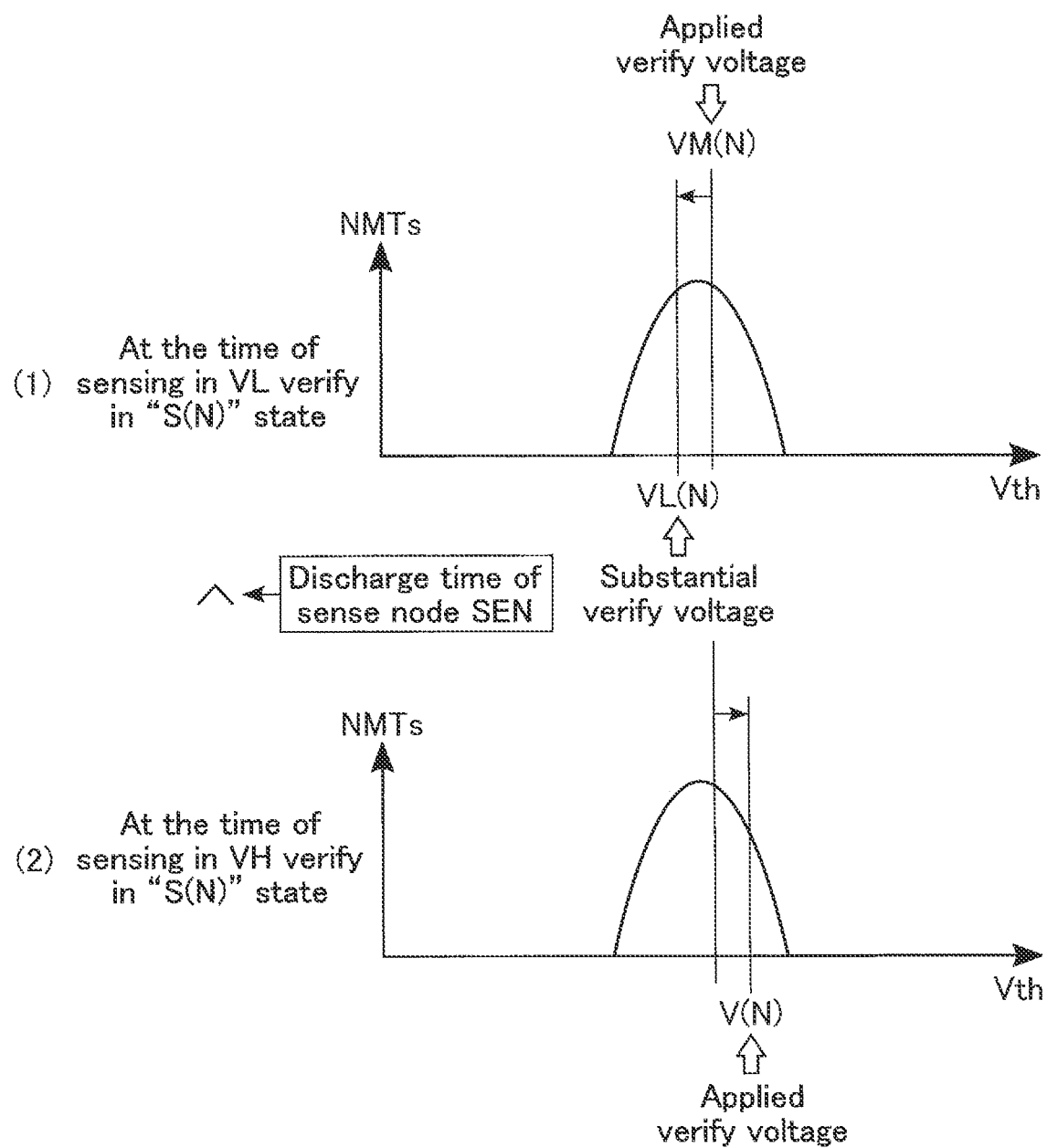
FIG. 28 is a conceptual diagram illustrating an example of a substantial verify voltage used in the semiconductor memory device of the eighth embodiment.

FIG. 28 is a conceptual diagram illustrating an example of a substantial verify voltage used in the semiconductor memory device 1 of the eighth embodiment. FIG. 28(1) illustrates a threshold voltage distribution at the time of sensing in the VL verify in the "S(N)" state, and also illustrates a verify voltage VM(N) that is applied and a substantial verify voltage. FIG. 28(2) illustrates a threshold voltage distribution at the time of sensing in the VH verify in the "S(N)" state, and also illustrates a verify voltage V(N) that is applied. In the present embodiment, the VL verify in the "S(N)" state and the VH verify in the "S(N)" state are executed during the verify operation in the "S(N)" state. The verify voltage VM(N) applied to the word line WLsel in the VL verify is set between the verify low voltage VL(N) and the verify voltage V(N).

In the semiconductor memory device 1 of the eighth embodiment, the discharge time of the sense node SEN is set to be shorter in the VL verify than in the VH verify. Thus, as illustrated in FIG. 20(1), the substantial verify voltage used in the VL verify in the "S(N)" state can be considered to be lower than the actually applied verify voltage VM(N). As a result, the semiconductor memory device 1 of the eighth embodiment can perform a VL verify using a desired verify low voltage VL.

Further, in the semiconductor memory device 1 of the eighth embodiment, the difference between the verify voltage applied in the VL verify and the verify voltage applied in the VH verify is smaller than the case where the verify low voltage VL is applied to the word line WLsel in the VL verify, as illustrated in FIG. 20(2). As a result, the semiconductor memory device 1 of the eighth embodiment can reduce the amount of voltage change of the word line WLsel when the VL verify transitions to the VH verify, and can therefore shorten the time required to stabilize the voltage of the word line WL.

From a different point of view, the semiconductor memory device 1 of the eighth embodiment widens the adjustment range of the verify low voltage VL in the VL verify, based on a combination of the shortened discharge time of the sense node SEN and the change of the voltage of the word line WL. As a result, the semiconductor memory device 1 of the eighth embodiment can set a more desirable verify low voltage VL, and can suppress the spread of the threshold voltage distribution in the write operation.

[9] Others

The above embodiments and modifications may be combined to the extent possible. For example, a semiconductor memory device 1 may change the VL verify method for each write state. Each of the first and second modifications of the first embodiment may be combined with other embodiments. The write state to which the VL verify described in connection with the eighth embodiment is applied and the write state to which the VL verify described in connection with the fifth embodiment is applied may be used in a mixed state. Other combinations may be used, and the operations of three or more embodiments may be combined.

The voltage sensing method of the sense node SEN described in the above embodiments is merely an example. Where the sense amplifier unit SAU has a different circuit configuration, the voltage of the sense node SEN may be detected by a method different from that described in connection with the embodiments. The semiconductor memory device achieves the same advantages as the above embodiments as long as during the write operation in each write state, the charge time and discharge time of the sense node SEN in the VL verify and the VH verify are processed in the same manner as in the above embodiments.

In connection with the above embodiments, reference was made to the case where the result of the verify read using a verify high voltage VH is stored in the latch circuit VHDL, but this is not restrictive. For example, the semiconductor memory device 1 may determine a VH verify pass by rewriting the data in the sense amplifier unit SAU to the same state as the erased state.

In connection with the above embodiments, reference was made to the case where a VH verify pass is determined by a program operation to which the second program method is applied, but this is not restrictive. If a VH verify failure is after a VL verify pass, the program operation using the second program method may be executed a plurality of times for a specific memory cell transistor MTsel.

In connection with the above embodiments, reference was made to the case where the sequencer 13 performs various operations, but this is not restrictive. The processing of the sequencer 13 described in connection with the embodiments may be executed by other circuits. For example, the semiconductor memory device 1 may include a counter, and this counter may be designed to count the number of memory cell transistors MT that have passed a verify.

The timing charts used for illustrating how the read operation is performed in the above embodiments are merely examples. For example, the timings at which the voltages of signals and interconnects are controlled may be shifted. Further, some of the processes of each flowchart can be rearranged in order. Further, in the above embodiments, the voltages applied to the various interconnects of the memory cell array 10 may be estimated based on the voltages of the signal lines CG, SGDD, SGDS, USGD, USGS, etc. For example, the voltage applied to the word line WLsel can be estimated based on the voltage of signal line CG.

In the present specification, the term "coupling" means that elements are electrically coupled to each other but another element may be interposed therebetween. The "ON state" is intended to indicate that a voltage equal to or higher than the threshold voltage of the transistor is applied to the gate of the transistor. The "OFF state" is intended to indicate that a voltage lower than the threshold voltage of the transistor is applied to the gate of the transistor. The "OFF state" does not exclude the case where a minute current such as a leak current of a transistor flows. The "H" level voltage is a voltage that turns on an N-type MOS transistor when the voltage is applied to the gate, and that turns off a P-type MOS transistor when the voltage is applied to the gate. The "L" level voltage is a voltage that turns off an N-type MOS transistor when the voltage is applied to the gate, and that turns on a P-type MOS transistor when the voltage is applied to the gate.

In the present specification, the sense amplifier unit SAU may be referred to as a sense circuit. "A program operation to which the first program method is applied" may be referred to as a "first program target". "A program operation to which the second program method is applied" may be referred to as a "second program target". The sequencer 13 may be referred to as a sequence controller, a controller or a control circuit. The operation of each configuration based on the control of the sequencer 13 may be described as the operation of the sequencer 13. "Charging the sense node SEN" corresponds to the period during which VHHL is applied to the node HHL. "Discharging the sense node SEN" corresponds to the period during which VXXL is applied to the node XXL. Each of VHHL and VXXL may be applied in a plurality of stages as long as it exceeds at least the "H" level.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor memory device comprising:
a plurality of memory cell transistors each capable of storing a plurality of bits of data, a threshold voltage of each of the memory cell transistors being included in one of a plurality of states, the states including a first state and a second state, the second state being higher than the first state, a memory cell transistor whose threshold voltage is included in the first state storing first data, and a memory cell transistor whose threshold voltage is included in the second state storing second data;
a word line coupled to the memory cell transistors; and
a controller configured to perform a write operation that includes a plurality of program loops each including a program operation and a verify operation,
wherein
a verify low voltage and a verify high voltage higher than the verify low voltage are set for each of the states, and
in a verify operation of the first data, during application of a verify high voltage of the first data to the word line, the controller determines whether or not a threshold voltage of a memory cell transistor to which the first data is to be written exceeds the verify high voltage of the first data, and also determine whether or not a threshold voltage of a memory cell transistor to which the second data is to be written exceeds a verify low voltage of the second data.

2. The device of claim 1, further comprising:
a plurality of bit lines coupled to the memory cell transistors, respectively,
wherein
in the verify operation, for each state of a write target, the controller is configured to:
set a memory cell transistor determined to have a threshold voltage equal to or lower than the verify low voltage, as a first program target;
set a memory cell transistor determined to have a threshold voltage exceeding the verify low voltage and being equal to or lower than the verify high voltage, as a second program target; and
set a memory cell transistor determined to have a threshold voltage exceeding the verify high voltage as program-inhibit, and
while a program voltage is being applied to the word line in the program operation, the controller is configured to:
apply a first voltage to a bit line coupled to the memory cell transistor of the first program target,
apply a second voltage higher than the first voltage to a bit line coupled to the memory cell transistor set as the second program target; and
apply a third voltage higher than the second voltage to a memory cell transistor set as program-inhibit.

3. The device of claim 1, wherein
the first state and the second state are adjacent to each other.

4. The device of claim 1, wherein
another state is set between the first state and the second state.

5. The device of claim 1, wherein
the states include a third state and a fourth state, the fourth state is higher than the third state, a memory cell transistor whose threshold voltage is included in the third state stores third data, and a memory cell transistor whose threshold voltage is included in the fourth state stores fourth data,
in a verify operation of the third data, during application of a verify high voltage of the third data to the word line, the controller is configured to determine whether or not a threshold voltage of a memory cell transistor to which the third data is to be written exceeds the verify high voltage, and also determine whether or not a threshold voltage of a memory cell transistor to which the fourth data is to be written exceeds the verify low voltage, and
states set between the first state and the second state are different in number from states set between the third state and the fourth state.

6. The device of claim 5, wherein
the first state and the second state are adjacent to each other, and
at least one state is set between the third state and the fourth state.

7. The device of claim 1, wherein
in the verify operation of the first data, the controller is configured to execute a first determination and a second determination in parallel,
in the first determination, the controller is configured to determine whether or not the threshold voltage of the memory cell transistor to which the first data is to be written exceeds the verify high voltage of the first data, and
in the second determination, the controller is configured to determine whether or not the threshold voltage of the memory cell transistor to which the second data is to be written exceeds the verify low voltage of the second data.

8. The device of claim 7, wherein
in the verify operation of the first data, the controller is configured to execute the first determination and the second determination simultaneously.

9. The device of claim 7, wherein
the verify high voltage of the first data and the verify low voltage of the second data are equal to each other.

10. The device of claim 1, further comprising:
a plurality of bit lines coupled to the memory cell transistors, respectively;
a first sense circuit coupled to a first bit line included among the bit lines, the first sense circuit including a first sense node, and the first sense circuit configured to determine a threshold voltage of a first memory cell transistor coupled to the first bit line, based on a voltage of the first sense node; and
a second sense circuit coupled to a second bit line included among the bit lines, the second sense circuit including a second sense node, the second sense circuit configured to determine a threshold voltage of a second memory cell transistor coupled to the second bit line, based on a voltage of the second sense node,
wherein
in the write operation, where the controller is configured to write the first data and the second data to the first memory cell transistor and the second memory cell transistor, respectively, a discharge time of the first sense node used for determining whether a threshold voltage of the first memory cell transistor exceeds the verify high voltage of the first data and a discharge time of the second node used for determining whether not a threshold voltage of the second memory cell transistor exceeds the verify low voltage of the second data are different from each other.

11. The device of claim 10, wherein
in the verify operation of the first data, the controller
first charges the first sense node and then discharges the first sense node for a first time, before a determination is made as to whether or not the threshold voltage of the first memory cell transistor exceeds the verify high voltage of the first data, and
first charges the second sense node and then discharges the second sense node for a second time longer than the first time, before a determination is made as to whether or not the threshold voltage of the second memory cell transistor exceeds the verify low voltage of the second data.

12. The device of claim 10, wherein
in the verify operation of the first data, the controller
first charges the first sense node and the second sense node and then discharges the first sense node and the second sense node for a first time, before a determination is made as to whether or not the threshold voltage of the first memory cell transistor exceeds the verify high voltage of the first data, and
discharges the second sense node for a third time without charging the second sense node, after a determination is made as to whether or not the threshold voltage of the first memory cell transistor exceeds the verify high voltage of the first data and before a determination is made as to whether or not the threshold voltage of the second memory cell transistor exceeds the verify low voltage of the second data.

13. The device of claim 10, wherein
in the verify operation of the first data, the controller
first charges the first sense node and then discharges the first sense node for a first time, before a determination is made as to whether or not the threshold voltage of the first memory cell transistor exceeds the verify high voltage of the first data, and
first charges the second node and then discharges the second node for a fourth time shorter than the first time, before a determination is made as to whether or not the threshold voltage of the second memory cell transistor exceeds the verify low voltage of the second data.

14. The device of claim 10, wherein
in the verify operation of the first data, the controller
first charges the first sense node and the second sense node and then discharges the first sense node and the second sense node for a fourth time, before a determination is made as to whether or not the threshold voltage of the second memory cell transistor exceeds the verify low voltage of the second data, and
discharges the first sense node and the second sense node for a fifth time without charging the first and second sense node, after a determination is made as to whether or not the threshold voltage of the second memory cell transistor exceeds the verify low voltage of the second data and before a determination is made as to whether or not the threshold voltage of the first memory cell transistor exceeds the verify high voltage of the first data.

15. The device of claim 2, wherein
the states include a fifth state, a memory cell transistor whose threshold voltage is included in the fifth state stores fifth data,
where at least a first condition, a second condition and a third condition are satisfied in the repetition of the program loop, the controller is configured to set a memory cell transistor to which the fifth data is to be written as the second program target,
the first condition is that a threshold voltage of the memory cell transistor to which the fifth data is to be written does not exceed a verify high voltage,
the second condition is that a verify low voltage of the fifth data is not determined as being exceeded in an immediately preceding program loop, and
the third condition is that a current number of program loops is equal to or greater than a first number.

16. The device of claim 2, wherein
the states include a sixth state and a seventh state, a memory cell transistor whose threshold voltage is included in the sixth state stores sixth data, and a memory cell transistor whose threshold voltage is included in the seventh state stores seventh data,
where at least a fourth condition, a fifth condition and a sixth condition are satisfied in the repetition of the program loop, the controller is configured to set a memory cell transistor to which the fifth data is to be written as the second program target,
the fourth condition is that a threshold voltage of the memory cell transistor to which the sixth data is to be written does not exceed a verify high voltage,
the fifth condition is that a verify low voltage of the sixth data is not determined as being exceeded in an immediately preceding program loop, and
the sixth condition is that a number of memory cell transistors that have passed a verify of the seventh data is equal to or greater than a second number in a current program loop.

17. The device of claim 16, wherein
the sixth state is higher than the seventh state.

18. The device of claim 1, wherein
the states include an eighth state, and a memory cell transistor whose threshold voltage is included in the eighth state stores eighth data,
where the eighth state is a state in which a program operation and a verify operation of a one-state preceding state are not executed in a write operation, the controller is configured to perform a verify operation of the eighth data such that:
a determination is made as to whether or not a threshold voltage of a memory cell transistor to which the eighth data is to be written exceeds a verify low voltage of the eighth data, while the verify low voltage of the eighth data is being applied to the word line; and
a determination is made as to whether or not a threshold voltage of the memory cell transistor to which the eighth data is to be written exceeds a verify high voltage of the eighth data, while the verify high voltage of the eighth data is being applied to the word line.

19. A semiconductor memory device comprising:
a plurality of memory cell transistors each storing a plurality of bits of data, each of threshold voltages of the memory cell transistors being included in one of a plurality of states, the states including a first state, and a memory cell transistor whose threshold voltage is included in the first state storing first data;
a word line coupled to the memory cell transistors;
a plurality of bit lines coupled to the memory cell transistors, respectively; and
a plurality of sense circuits coupled to the bit lines, respectively, each of the sense circuits including a sense node, and each of the sense circuits determining a threshold voltage of a memory cell transistor, based on a voltage of the sense node; and
a controller configured to perform a write operation that includes repetition of a program loop including a program operation and a verify operation,
wherein
a verify low voltage and a verify high voltage are set for each of the states,
in a verify operation of the first data, the controller
charges each of the sense nodes of the sense circuits while a first voltage intermediate between a verify low voltage of the first data and a verify high voltage of the first data is being applied to the word line, and first charges each of the sense nodes of the sense circuits and then discharges each of the sense nodes in a second time longer than the first time while the verify high voltage of the first data is being applied to the word line, and
a sense circuit coupled to a memory cell transistor to which the first data is to be written determines whether or not a threshold voltage of the memory cell transistor to which the first data is to be written exceeds the verify low voltage of the first data while the first voltage is being applied to the word line, and determines whether or not the threshold voltage of the memory cell transistor to which the first data is to be written exceeds the verify high voltage of the first data.

20. The device of claim 19, wherein
in the verify operation, for each state of a write target, the controller is configured to:
set a memory cell transistor determined to have a threshold voltage equal to or lower than a verify low voltage, as a first program target;
set a memory cell transistor determined to have a threshold voltage exceeding the verify low voltage and being equal to or lower than a verify high voltage, as a second program target; and
set a memory cell transistor determined to have a threshold voltage exceeding the verify high voltage as program-inhibit, and
while a program voltage is being applied to the word line in the program operation, the controller is configured to:
apply a first voltage to a bit line coupled to a memory cell transistor as the first program target;
apply a second voltage higher than the first voltage to a bit line coupled to a memory cell transistor set as the second program target; and
apply a third voltage higher than the second voltage to a memory cell transistor set as program-inhibit.

* * * * *